US012645136B2

(12) United States Patent
Lee et al.

(10) Patent No.: US 12,645,136 B2
(45) Date of Patent: Jun. 2, 2026

(54) EXTREME ULTRAVIOLET MASK WITH CAPPING LAYER

(71) Applicant: Taiwan Semiconductor Manufacturing Co., Ltd., Hsinchu (TW)

(72) Inventors: Hsin-Chang Lee, Hsinchu (TW); Pei-Cheng Hsu, Hsinchu (TW); Wei-Hao Lee, Hsinchu (TW); Ping-Hsun Lin, Hsinchu (TW); Ta-Cheng Lien, Hsinchu (TW); Ching-Fang Yu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 792 days.

(21) Appl. No.: 17/749,033

(22) Filed: May 19, 2022

(65) Prior Publication Data

US 2023/0161241 A1     May 25, 2023

Related U.S. Application Data

(60) Provisional application No. 63/282,289, filed on Nov. 23, 2021.

(51) Int. Cl.
*G03F 1/24* (2012.01)
*G03F 1/22* (2012.01)

(52) U.S. Cl.
CPC . *G03F 1/24* (2013.01); *G03F 1/22* (2013.01)

(58) Field of Classification Search
CPC ..................................... G03F 1/22; G03F 1/24
See application file for complete search history.

(56) References Cited

U.S. PATENT DOCUMENTS

| | | | | |
|---|---|---|---|---|
| 2007/0081229 A1* | 4/2007 | Shiraishi | ................ | G03F 7/706 |
| | | | | 430/311 |
| 2008/0318140 A1* | 12/2008 | Hayashi | ................ | G21K 1/062 |
| | | | | 430/5 |
| 2014/0272678 A1* | 9/2014 | Shih | ........................ | G03F 7/20 |
| | | | | 430/5 |
| 2015/0010854 A1 | 1/2015 | Seo et al. | | |
| 2018/0373138 A1* | 12/2018 | Yu | ............................ | G03F 1/24 |
| 2021/0018828 A1* | 1/2021 | Lin | ........................... | G03F 1/52 |
| 2021/0063865 A1 | 3/2021 | Lin | | |

FOREIGN PATENT DOCUMENTS

| | | |
|---|---|---|
| CN | 113253562 A | 8/2021 |
| CN | 113253563 A | 8/2021 |
| DE | 102016114882 A1 | 12/2017 |

(Continued)

*Primary Examiner* — Mark F. Huff
(74) *Attorney, Agent, or Firm* — Seed IP Law Group

(57) ABSTRACT

An extreme ultraviolet (EUV) mask, includes a substrate, a reflective multilayer stack on the substrate, and a single layer or multi-layer capping feature on the reflective multilayer stack. The capping feature includes a capping layer or capping layers including a material having an amorphous structure. Other described embodiments include capping layer(s) that contain element(s) having a first solid carbon solubility less than about 3. In multilayer capping feature embodiments, element(s) of the respective capping layers have different solid carbon solubility properties.

20 Claims, 16 Drawing Sheets

(56) References Cited

FOREIGN PATENT DOCUMENTS

| | | | |
|----|----|----|----|
| DE | 102020114852 | A1 | 11/2021 |
| JP | 2004517484 | A | 6/2004 |
| KR | 20210138460 | A | 11/2021 |
| TW | 202001407 | A | 1/2020 |
| TW | 202109208 | A | 3/2021 |
| TW | 202111419 | A | 3/2021 |

* cited by examiner 6.5nm

EXTREME ULTRAVIOLET MASK WITH CAPPING LAYER

PRIORITY CLAIM AND CROSS-REFERENCE

This application claims the benefit of U.S. Provisional Patent Application No. 63/282,289 filed Nov. 23, 2021, which is incorporated by reference herein in its entirety.

BACKGROUND

The semiconductor industry has experienced exponential growth. Technological advances in materials and design have produced generations of integrated circuits (ICs), where each generation has smaller and more complex circuits than the previous generation. In the course of IC evolution, functional density (i.e., the number of interconnected devices per chip area) has generally increased while geometry size (i.e., the smallest component or line that can be created using a fabrication process) has decreased. This scaling down process generally provides benefits by increasing production efficiency and lowering associated costs.

Photolithography may be used to form the components or lines on a semiconductor wafer. One example of a photolithographic technique utilizes extreme ultraviolet (EUV) energy and a patterned absorber layer of an EUV mask.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
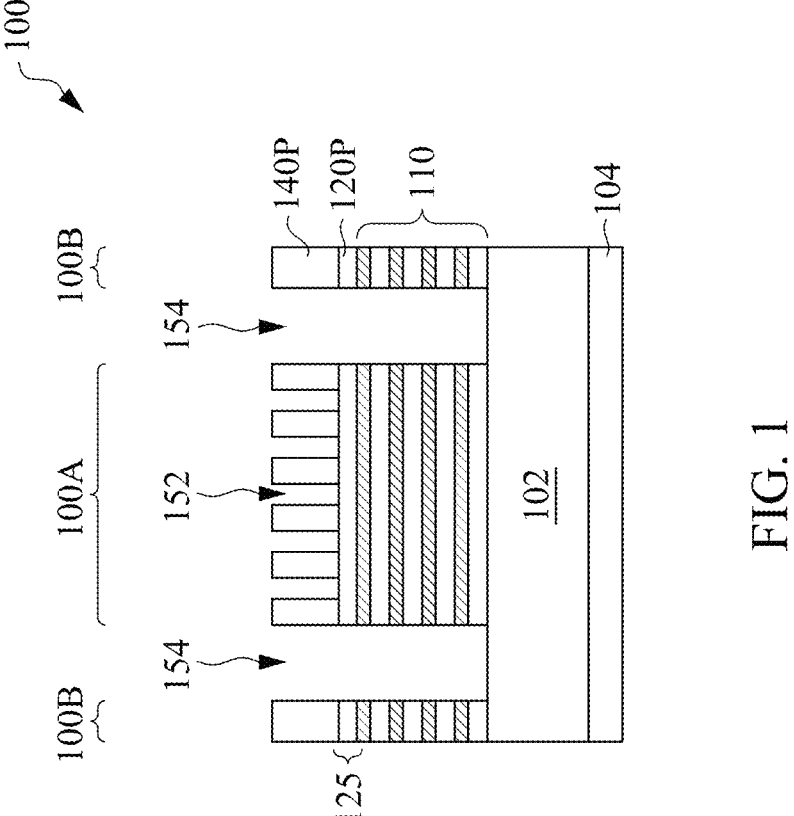
FIG. 1 is a cross-sectional view of an extreme ultraviolet (EUV) mask, in accordance with a first embodiment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the manufacture of integrated circuits (ICs), patterns representing different layers of the ICs are fabricated using a series of reusable photomasks (also referred to herein as photolithography masks or masks) in order to transfer the design of each layer of the ICs onto a semiconductor substrate during the semiconductor device fabrication process.

With the shrinkage in IC size, extreme ultraviolet (EUV) light, for example, with a wavelength of 13.5 nm is employed in a lithographic process to enable transfer of very small patterns (e.g., nanometer-scale patterns) from a mask to a semiconductor wafer. Because most materials are highly absorbing at the wavelength of 13.5 nm, EUV lithography utilizes a reflective-type EUV mask having a reflective multilayer to reflect the incident EUV light and an absorber layer on top of the reflective multilayer to absorb radiation in areas where light is not intended to be reflected by the mask. The reflective multilayer and absorber layer are on a low thermal expansion material substrate. The reflective multilayer reflects the incident EUV light and the patterned absorber layer on top of the reflective multilayer absorbs light in areas where light is not intended to be reflected by the mask. The mask pattern is defined by the absorber layer and is transferred to a semiconductor wafer by reflecting EUV light off portions of a reflective surface of the EUV mask.

An ongoing desire to have more densely packed integrated devices has resulted in changes to the photolithography process in order to form smaller individual feature sizes. The minimum feature size or "critical dimension" (CD) obtainable by a process is determined approximately by the formula $CD = k_1 * \lambda/NA$, where $k_1$ is a process-specific coefficient, $\lambda$ is the wavelength of applied light/energy, and NA is the numerical aperture of the optical lens as seen from the substrate or wafer.

The present disclosure describes various embodiments of an EUV mask that exhibits a resistance to carbon contamination and utilizes durable capping features that protect the underlying reflective multilayer stack from oxidants even after being exposed to etching or cleaning processes during the manufacture of the mask. Carbon contamination can negatively affect the critical dimension of features formed in an absorber layer and a capping feature of the EUV mask. For example, some materials used as a capping layer may have many free radicals that can react with carbon atoms near the EUV mask surface during exposure to EUV energy.

During exposure, hydrocarbon molecules near the surface of the EUV mask can be cracked when exposed to high energy and deposit onto exposed surfaces (e.g., sidewalls and bottoms or trenches in the absorber material) of the EUV mask. Cracking of the hydrocarbon molecules can produce carbon atoms that can react with the free radicals. It has been observed that carbon deposits to greater thicknesses on exposed surfaces of the mask that are near the center of the mask compared to exposed surfaces of the mask that are near edges of the mask. In some embodiments, the amount of carbon that forms on the exposed surfaces near the center of the mask is three times as thick as the carbon that forms on exposed surfaces near the edges of the mask. The hydrocarbons may originate from numerous sources, including outgassing from materials within the EUV tool, such as structures of the tool, photoresists or hard masks used in the tool. The resulting carbon atoms or carbon containing molecules react with or are absorbed by materials they come in contact with and build up on surfaces of the EUV mask. The buildup of carbon on surfaces of the EUV mask, e.g., surfaces of the capping layer or sidewalls of features in the absorber material, can negatively affect the ability of the EUV mask to pattern features on a substrate that meet critical dimension criteria, such as critical dimension uniformity (CDU). For example, carbon absorbs EUV wavelengths to a greater degree than other materials making up an EUV mask. Thus, when unwanted carbon is present on an EUV mask, the exposure energy or amount of incident EUV energy needed to achieve a desired level of EUV radiation reflected from the mask is greater than when the unwanted carbon is not present. In some embodiments, depending on the critical dimension of the features on the wafer and the critical dimensions of the features on the mask, the exposure energy needed when carbon is present on the EUV mask can be 10% or more than when carbon is not present on the EUV mask. This need for increased exposure energy will increase the cost of the energy required to effectively expose the wafer or will increase the length of time needed to achieve a desired level of exposure.

Some embodiments of EUV masks of the present disclosure exhibit improved strength and/or resistance to etching and cleaning processes to which the materials of the EUV mask are exposed during manufacturing of the mask. The strength and/or resistance to etching and cleaning processes to which the materials of the EUV mask exposed during manufacturing of the mask is important because a weak or damaged layer of the mask is susceptible to infiltration by oxidants, such as oxygen. Oxygen that infiltrates a damaged or weak layer of the mask can react with materials of the reflective multilayer and form unwanted oxide layers on a top surface of the reflective multilayer.

Embodiments in accordance with the present disclosure broadly provide a photolithography mask that includes a capping feature over the reflective multilayer stack of the mask. In some embodiments, the capping feature includes a single layer of capping material and in other embodiments, the capping feature includes multiple capping layers of capping material. In some embodiments, the capping feature includes a first capping layer that includes material having an amorphous structure. This first capping layer can be combined with a second capping layer that includes materials having an amorphous structure. In some embodiments, the material of the first capping layer includes an element having a solid carbon solubility at the eutectic point, of a system containing the element and carbon, that is less than 3 atomic %. Examples of elements useful in a capping layer of a capping feature in accordance with embodiments of the present disclosure include Rh, Ir, Pt, Au and Zr or alloys thereof. In other embodiments, a capping layer of a capping feature in accordance with embodiments of the present disclosure includes Hf, Nb or N. In other embodiments, a capping layer of a capping feature in accordance with the present disclosure includes Ag or Cu. In other embodiments, a capping layer of a capping feature in accordance with the present disclosure includes Pd. In accordance with embodiments of the present disclosure, a single layered capping feature is employed to reduce carbon buildup or contamination on surfaces of the EUV mask. The materials of a capping layer formed in accordance with the present disclosure reduce the susceptibility of the capping feature to contamination with hydrocarbon molecules or carbon atoms. The materials of a capping feature formed in accordance with the present disclosure also protect an underlying reflective multilayer from exposure to oxidants and formation of unwanted oxide layers.

In examples of the present disclosure directed to a multilayered capping feature, the material used for one capping layer of the multilayered capping feature is different in composition from the material used for another capping layer of the multilayered capping feature. Such materials can be in accordance with the description in the previous paragraph regarding the materials for use in a capping feature that includes only a single capping layer. In some embodiments, the material of one capping layer exhibits a solid carbon solubility property that is different from a solid carbon solubility property of the material of another capping layer of the multilayered capping feature. For example, in some embodiments, a multilayered capping feature is provided that includes a first capping layer formed of a material including an element having a first carbon solubility property. The multilayered capping feature includes at least another capping layer formed of a material including an element having a second carbon solubility property that is different from the first carbon solubility property of the element of the material of the first capping layer. In some embodiments the, the solid carbon solubility of the elements of the material of the first capping layer and the second capping layer at an eutectic point, of a system containing the element and carbon, is less than 3 atomic %. The solid carbon solubility property refers to the maximum carbon solubility in a solid phase, of a system containing the element and carbon, which is in equilibrium with a liquid phase of the system at an eutectic point of the system. Solid carbon solubility of an element of the material of a capping layer is an indication of the propensity of an element of a capping layer to react with, retain, attract or absorb carbon atoms or carbon containing molecules. When the carbon atoms are attracted to and retained or absorbed by or react with the material of the capping layer, they build up and contaminate the capping layer. In some situations, the carbon build up or contamination completely covers exposed portions of the capping layer. In other situations, the carbon build up or contamination partially covers the capping layer. In other situations, the carbon buildup or contamination at least partially covers portions of sidewalls of the absorber material of the mask. The presence of a layer of carbon contamination changes dimensions and EUV transmission properties of the mask. Such changes in dimension and/or changes in the incident EUV energy needed to produce a desired intensity of reflected EUV energy causes the negative issues described in the previous paragraph. In accordance with embodiments of the present disclosure, a multilayered capping feature including multiple individual capping layers is employed to protect EUV masks from carbon buildup or contamination on surfaces of the EUV mask. The materials of the capping layers formed in accordance with the present disclosure reduce the susceptibility of the multilayered capping feature to contamination with hydrocarbon molecules or carbon atoms. The materials of a capping feature formed in accordance with the present disclosure also protect an underlying reflective multilayer from exposure to oxidants and formation of unwanted oxide layers.

In embodiments of the present disclosure, an EUV mask includes a multilayered capping feature that includes at least one capping layer that includes a material containing an element having a low solid carbon solubility. A solid carbon solubility of an element is characterized by a maximum carbon solubility in a solid phase, of a system of the element and carbon, in equilibrium with a liquid phase of the system at the eutectic point of the system. An example of an element that has a low solid carbon solubility is an element having a solid carbon solubility that is less than about 3 atomic percent. Examples of elements having a low atomic percent solid carbon solubility include, but are not limited to, elements that have a solid carbon solubility that is less than about 3 atomic % and in some embodiments less than 2 atomic %. For example, in some embodiments, materials of a capping layer do not have a solid carbon solubility that is less than about 3 atomic %, yet still provide a resistance to carbon buildup or contamination on the surface of the material. Elements having low solid carbon solubility that are useful in embodiments of the present disclosure are alternatively characterized by an effective solid carbon solubility in the element at 1000° C. of less than 1.6. The effective solid carbon solubility in the element at 1000° C. is obtained by multiplying the eutectic point solid carbon solubility value by 1000° C./the eutectic point of the element and carbon system. In accordance with some embodiments of multilayered capping features of the present disclosure, the element(s) of the material of one capping layer has a solid carbon solubility that is different from the solid carbon solubility of element(s) of the material of another capping layer forming the multilayered capping feature. In some embodiments, the material of at least one layer of the multilayered capping feature includes an element that has an EUV extinction coefficient for EUV radiation having a wavelength of 13.5 nm that is greater than or less than an EUV extinction coefficient for EUV radiation having a wavelength of 13.5 nm of an element of another layer of the multilayered capping feature. When the individual capping layers of the multilayered capping feature include materials that include elements having differing EUV extinction coefficients for EUV radiation having a wavelength of 13.5 nm, the amount of incident EUV energy absorbed in one capping layer is different from the EUV energy absorbed in another capping layer of the multilayered capping feature. For example, in some embodiments, an element of the material of one capping layer has an EUV extinction coefficient for EUV radiation having a wavelength of 13.5 nm between 0 and 0.1 and an element of the material of another capping layer has an EUV extinction coefficient for EUV radiation having a wavelength of 13.5 nm different from the EUV extinction coefficient of the element of the one capping layer. In other embodiments, the material of the first capping layer includes an element having an EUV extinction coefficient for EUV radiation having a wavelength of 13.5 nm between 0 and 0.08, between 0 and 0.06, between 0 and 0.04 or between 0 and 0.02. Materials that include an element having an EUV extinction coefficient for EUV radiation having a wavelength of 13.5 nm within the ranges described above do not reduce the transmission of EUV energy by an amount that requires that the level of incident EUV energy be increased by an undesirable amount. The materials for use in capping layers of the multilayered capping features in accordance with the present embodiments, should not absorb so much EUV energy that the amount of EUV energy incident on the EUV mask needs to be increased or the exposure time needs to be increased an undesirable amount. In addition, the materials for use in an individual capping layer of a capping feature or in capping layers of the multilayered capping features in accordance with disclosed embodiments exhibit good adhesion to each other as well as materials upon which the capping layer(s) are deposited or with materials that are deposited onto the capping layer(s). Elements that are suitable as a material for a capping layer in accordance with embodiments of the present disclosure include elements that exhibit a binding energy for carbon that is less than about 285 electronvolts (eV). Examples of elements that have a binding energy for carbon that is less than about 285 CV include Rh, Ir and Pt. Elements that have a binding energy for carbon that is less than about 285 CV are not limited to Rh, Ir and Pt. Other elements that have a binding energy for carbon that is less than about 285 CV are also useful as an element of a material used for in capping layers in accordance with the present disclosure.

In some embodiments, the capping feature includes at least one capping layer including rhodium (Rh), iridium (Ir), platinum (Pt), gold (Au) and/or zirconium (Zr) or alloys thereof. Examples of alloys of Rh, Ir, Pt, Au or Zr include RuZr, IrZr, RhZr, HfZr, NbZr and ZnZr. Additional examples of alloys of Rh, Ir, Pt, Au or Zr in accordance with the present disclosure include RuRh, RuIr, RuPt, PtIr, RuIrPt, NbIr, NbPt, NbRh, RhN, IrN, RuRhN, RuIrN, RuPtN, PtIrN, RuIrPtN, NbIrN, NbPtN and NbRhN. For example, a capping layer in accordance with the present disclosure can include an alloy such as RuRh (5 at %~100 at % Rh), RuIr (5 at %~100 at % Ir), RuPt (5 at %~100 at % Pt), PtIr (5 at %~100 at % Ir), RuIrPt (5 at %~100 at % Ir), RuIrPt (5 at %~100 at % Pt), NbIr (5 at %~100 at % Ir), NbPt (5 at %~100 at % Pt), NbRh (5 at %~100 at % Rh), RhN (5 at %~100 at % Rh), IrN (5 at %~100 at % Ir), RuRhN (5 at %~100 at % Rh), RuRhN (5 at %~100 at % N), RuIrN (5 at %~100 at % Ir), RuIrN (5 at %~100 at % N), RuPtN (5 at %~100 at % Pt), RuPtN (5 at %~100 at % N), PtIrN (5 at %~100 at % Ir), PtIrN (5 at %~100 at % N), RuIrPtN (5 at %~100 at % Ir), RuIrPtN (5 at %~100 at % Pt), RuIrPtN (5 at %~100 at % N), NbIrN (5 at %~100 at % Ir), NbPtN (5 at %~100 at % Pt) or NbRhN (5 at %~100 at % Rh). In other embodiments, a capping layer in accordance with the present disclosure can include an alloy that contains Hf, Nb or N. In other embodiments, a capping layer in accordance with the present disclosure can include an alloy that contains Ag or Cu. In other embodiments, a capping layer in accordance with the present disclosure can include an alloy that contains Pd.

In some embodiments, the single or multilayered capping feature includes at least one layer that includes a material containing an element having an index of refraction of greater than 0.87 and less than 0.97. Examples of materials having an index of refraction of greater than 0.87 and less than 0.97 include, but are not limited to the materials described above.

FIG. 1 is a cross-sectional view of an EUV mask 100, in accordance with a first embodiment of the present disclosure. Referring to FIG. 1, the EUV mask 100 includes a substrate 102, a reflective multilayer stack 110 over a front surface of the substrate 102, a capping feature 125 over the reflective multilayer stack 110 that includes a first patterned capping layer 120P and a patterned absorber layer 140P over the capping feature 125. The EUV mask 100 further includes a conductive layer 104 over a back surface of the substrate 102 opposite the front surface.

The patterned absorber layer 140P contains a pattern of openings 152 that correspond to patterns of conductive or non-conductive features to be formed on or in a semiconductor wafer. The pattern of openings 152 is located in a pattern region 100A of the EUV mask 100, exposing a surface of the first patterned capping layer 120P. The pattern region 100A is surrounded by a peripheral region 100B of the EUV mask 100. The peripheral region 100B corresponds to a non-patterned region of the EUV mask 100 that is not used in an exposing process during IC fabrication. In some embodiments, the pattern region 100A of EUV mask 100 is located at a central region of the substrate 102, and the peripheral region 100B is located at an edge portion of the substrate 102. The pattern region 100A is separated from the peripheral region 100B by trenches 154. The trenches 154 extend through the patterned absorber layer 140P, the first patterned capping layer 120P, and the reflective multilayer stack 110, exposing the front surface of the substrate 102.

In accordance with some embodiments of the present disclosure, patterned absorber layer 140P is a layer of absorber material that is an alloy of a transition metal, e.g., tantalum (Ta), ruthenium (Ru), chromium (Cr), platinum (Pt), gold (Au), iridium (Ir), titanium (Ti), niobium (Nb), rhodium (Rh), molybdenum (Mo), tungsten (W), or palladium (Pd), and at least one alloying element selected from ruthenium (Ru), chromium (Cr), tantalum (Ta), platinum (Pt), palladium (Pd), tungsten (W), gold (Au), iridium (Ir), titanium (Ti), niobium (Nb), rhodium (Rh), molybdenum (Mo), hafnium (Hf), boron (B), nitrogen (N), oxygen (O), silicon (Si), zirconium (Zr), or vanadium (V).

Figure 2:
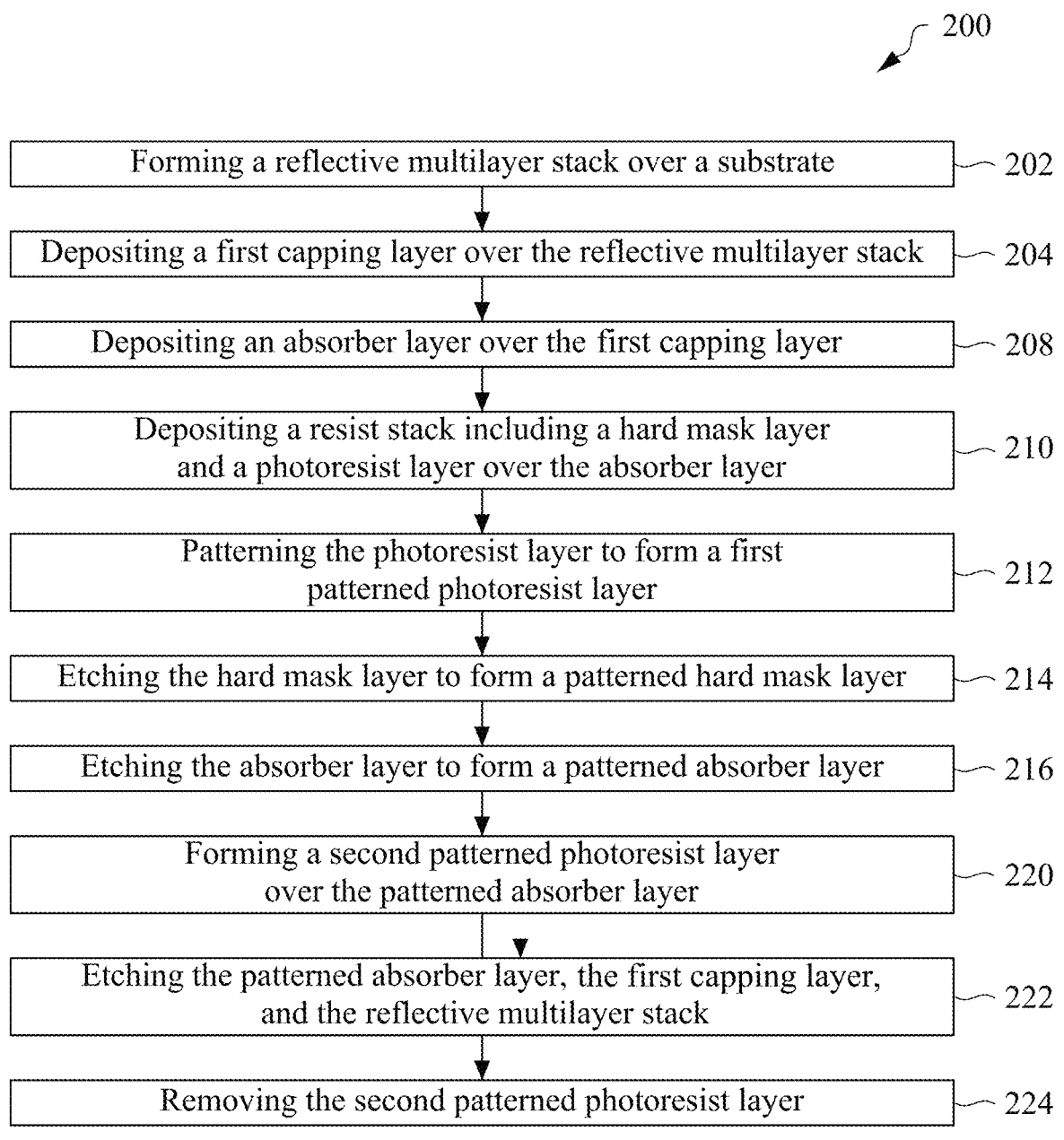
FIG. 2 is a flowchart of a method for fabricating the EUV mask of FIG. 1, in accordance with some embodiments.

FIG. 2 is a flowchart of a method 200 for fabricating an EUV mask in accordance with an embodiment of the present disclosure, for example, EUV mask 100. FIG. 3A through FIG. 3J are cross-sectional views of the EUV mask 100 at various stages of the fabrication process, in accordance with some embodiments. The method 200 is discussed in detail below, with reference to the EUV mask 100. In some embodiments, additional operations are performed before, during, and/or after the method 200, or some of the operations described are replaced and/or eliminated. In some embodiments, some of the features described below are replaced or eliminated. One of ordinary skill in the art would understand that although some embodiments are discussed with operations performed in a particular order, these operations may be performed in another logical order.

Figure 3B:
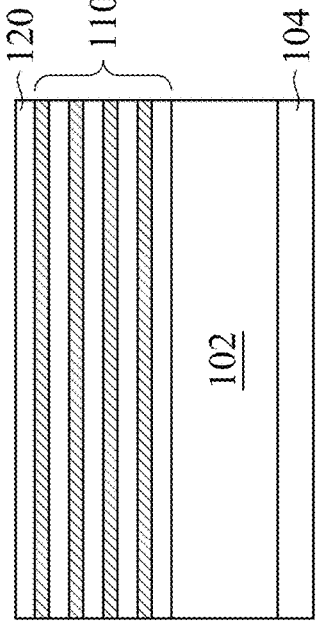
FIGS. 3A-3J are cross-sectional views of an EUV mask at various stages of the fabrication process of FIG. 2, in accordance with some embodiments.
Figure 3D:
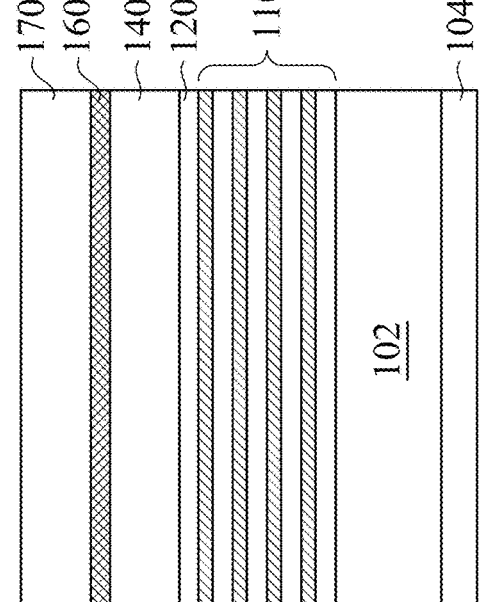
Figure 3A:
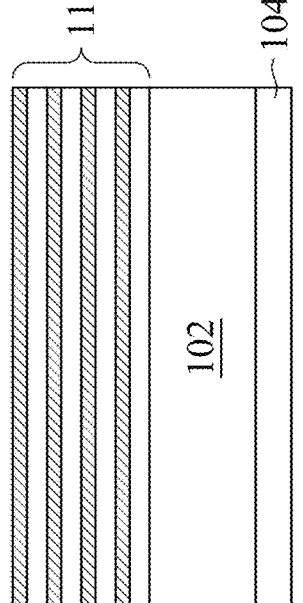

Referring to FIGS. 2 and 3A, the method 200 includes operation 202, in which a reflective multilayer stack 110 is formed over a substrate 102, in accordance with some embodiments. FIG. 3A is a cross-sectional view of an initial structure of an EUV mask 100 after forming the reflective multilayer stack 110 over the substrate 102, in accordance with some embodiments.

Referring to FIG. 3A, the initial structure of the EUV mask 100 includes a substrate 102 made of glass, silicon, quartz, or other low thermal expansion materials. The low thermal expansion material helps to minimize image distortion due to mask heating during use of the EUV mask 100. In some embodiments, the substrate 102 includes fused silica, fused quartz, calcium fluoride, silicon carbide, black diamond, or titanium oxide doped silicon oxide ($SiO_2/TiO_2$). In some embodiments, the substrate 102 has a thickness ranging from about 1 mm to about 7 mm. If the thickness of the substrate 102 is too small, a risk of breakage or warping of the EUV mask 100 increases, in some instances. On the other hand, if the thickness of the substrate is too great, a weight and cost of the EUV mask 100 is needlessly increased, in some instances.

In some embodiments, a conductive layer 104 is disposed on a back surface of the substrate 102. In some embodiments, the conductive layer 104 is in direct contact with the back surface of the substrate 102. The conductive layer 104 is adapted to provide for electrostatically coupling of the EUV mask 100 to an electrostatic mask chuck (not shown) during fabrication and use of the EUV mask 100. In some embodiments, the conductive layer 104 includes chromium nitride (CrN) or tantalum boride (TaB). In some embodiments, the conductive layer 104 is formed by a deposition process such as, for example, chemical vapor deposition (CVD), plasma-enhanced chemical vapor deposition (PECVD), or physical vapor deposition (PVD). The thickness of the conductive layer 104 is controlled such that the conductive layer 104 is optically transparent.

The reflective multilayer stack 110 is disposed over a front surface of the substrate 102 opposite the back surface. In some embodiments, the reflective multilayer stack 110 is in direct contact with the front surface of the substrate 102. The reflective multilayer stack 110 provides a high reflectivity to the EUV light. In some embodiments, the reflective multilayer stack 110 is configured to achieve about 60% to about 75% reflectivity at the peak EUV illumination wavelength, e.g., the EUV illumination at 13.5 nm. Specifically, when the EUV light is applied at an incident angle of 6° to the surface of the reflective multilayer stack 110, the maximum reflectivity of light in the vicinity of a wavelength of 13.5 nm is about 60%, about 62%, about 65%, about 68%, about 70%, about 72%, or about 75%.

In some embodiments, the reflective multilayer stack 110 includes alternatively stacked layers of a high refractive index material and a low refractive index material. A material having a high refractive index has a tendency to scatter EUV light on the one hand, and a material having a low refractive index has a tendency to transmit EUV light on the other hand. Pairing these two type materials together provides a resonant reflectivity. In some embodiments, the reflective multilayer stack 110 includes alternatively stacked layers of molybdenum (Mo) and silicon (Si). In some embodiments, the reflective multilayer stack 110 includes alternatively stacked Mo and Si layers with Si being in the topmost layer. In some embodiments, a molybdenum layer is in direct contact with the front surface of the substrate 102. In some other embodiments, a silicon layer is in direct contact with the front surface of the substrate 102. Alternatively, the reflective multilayer stack 110 includes alternatively stacked layers of Mo and beryllium (Be).

The thickness of each layer in the reflective multilayer stack 110 depends on the EUV wavelength and the incident angle of the EUV light. The thickness of alternating layers in the reflective multilayer stack 110 is tuned to maximize the constructive interference of the EUV light reflected at each interface and to minimize the overall absorption of the EUV light. In some embodiments, the reflective multilayer stack 110 includes from 30 to 60 pairs of alternating layers of Mo and Si. Each Mo/Si pair has a thickness ranging from about 2 nm to about 7 nm, with a total thickness ranging from about 100 nm to about 300 nm. In some embodiments, the thickness of the alternating layers in the reflective multilayer stack 110 are different.

In some embodiments, each layer in the reflective multilayer stack 110 is deposited over the substrate 102 and underlying layer using ion beam deposition (IBD) or DC magnetron sputtering. The deposition method used helps to ensure that the thickness uniformity of the reflective multilayer stack 110 is better than about 0.85 across the substrate 102. For example, to form a Mo/Si reflective multilayer stack 110, a Mo layer is deposited using a Mo target as the sputtering target and an argon (Ar) gas (having a gas pressure of from $1.3 \times 10^{-2}$ Pa to $2.7 \times 10^{-2}$ Pa) as the sputtering gas with an ion acceleration voltage of from 300 V to 1,500 V at a deposition rate of from 0.03 to 0.30 nm/sec and then a Si layer is deposited using a Si target as the sputtering target and an Ar gas (having a gas pressure of $1.3 \times 10^{-2}$ Pa to $2.7 \times 10^{-2}$ Pa) as the sputtering gas, with an ion acceleration voltage of from 300 V to 1,500 V at a deposition rate of from 0.03 to 0.30 nm/sec. By stacking Si layers and Mo layers in 40 to 50 cycles, each of the cycles comprising the above steps, the Mo/Si reflective multilayer stack is deposited.

Referring to FIGS. 2 and 3B, the method 200 proceeds to operation 204, in which a first capping layer 120 is deposited over the reflective multilayer stack 110, in accordance with some embodiments. FIG. 3B is a cross-sectional view of the structure of FIG. 3A after depositing the first capping layer 120 over the reflective multilayer stack 110, in accordance with some embodiments.

Referring to FIG. 3B, the first capping layer 120 (of the capping feature 125 in FIGS. 1 and 3C) is disposed over the topmost surface of the reflective multilayer stack 110. As described herein, the first capping layer 120 includes a material in an amorphous state. In some embodiments, the material has an element with low solid carbon solubility which serves to prevent or reduce the amount of carbon contamination of the mask.

Materials in an amorphous state include materials that are solid and lack the long-range order that is characteristic of a crystal. Materials in an amorphous state are sometimes referred to as being in a glass or glassy state. A "glassy solid" or "amorphous solid" is considered to be the overarching concept, with glass being a special case, where glass is an amorphous solid stabilized below its glass transition temperature. Polymers are often amorphous. Other types of amorphous solids include gels, thin films and nanostructured materials. Materials in an amorphous state have an internal structure made of interconnected structural blocks. These blocks can be similar to the basic structural units found in the corresponding crystalline phase of the same material. Nano-crystalline materials are examples of materials in an amorphous state and in the present disclosure are characterized by a grain size of less than 5 nm, less than 4 nm, less than 3 nm or less than 2 nm. Materials that are in an amorphous state and useful as a material of a capping layer in accordance with the present disclosure include the materials for a capping layer described above.

In some embodiments, the first capping layer 120 includes a material that is less susceptible to carbon contamination compared to conventional materials used as capping layers. Such materials have been described above. As described above, such materials include elements that have a low effective solid carbon solubility in the element of the material at 1000° C., e.g., an effective solid carbon solubility of less than 1.6 atomic % at 1000° C. Other examples of materials including elements having a low atomic percent effective solid carbon solubility at 1000° C. include, but are not limited to materials including elements that have an effective solid carbon solubility at 1000° C. that is less than about 1.3 atomic percent. In some embodiments, materials of a capping layer include elements that do not have an effective solid carbon solubility that is less than about 1.6 atomic percent or less than about 1.3 atomic percent, yet still provide a resistance to carbon buildup or contamination on the surface of the material. In some embodiments in accordance with FIG. 1, the material of the first capping layer 120 includes an element that has an EUV extinction coefficient for EUV radiation having a wavelength of 13.5 nm between 0 and 0.1, 0 and 0.08, 0 and 0.06, 0 and 0.04 or between 0 and 0.02. Materials that include elements having an EUV extinction coefficient for EUV radiation having a wavelength of 13.5 nm with the foregoing ranges do not reduce the transmission of EUV energy by an amount that requires that the level of incident EUV energy be increased by an undesirable amount. The materials for use in capping layers of the capping features in accordance with the present embodiments, should not absorb so much EUV energy that the amount of EUV energy incident on the EUV mask needs to be increased or the exposure time needs to be increased an undesirable amount. In addition, the materials for use in capping layers of the capping features in accordance with the present embodiment exhibit good adhesion to materials upon which the capping layers are deposited or with materials that are deposited onto the capping layer. In accordance with embodiments of the present disclosure, carbides of the elements described above are undesirable for use as a material for first capping layer 120 because carbon atoms from the carbide can diffuse into a lower layer during heat treatment thereof. In some embodiments the multilayered capping feature 125 includes at least one layer 120 that includes a material containing an element having an index of refraction for EUV radiation having a wavelength of 13.5 nm of less than 0.97. In some embodiments the multilayered capping feature 125 includes at least one layer 120 that includes a material containing an element having an index of refraction for EUV radiation having a wavelength of 13.5 nm that is greater than 0.87. Examples of materials including elements having an index of refraction for EUV radiation having a wavelength of 13.5 nm of less than 0.97 or greater than 0.87 include, but are not limited to the materials described above. In some embodiments, the first capping layer 120 has a thickness ranging from about 0.5 to 5 nm. First capping layer 120 having a thickness ranging from about 0.5 to 5 nm has a thickness that is sufficient to prevent or reduce carbon contamination while not being so thick as to reduce EUV transmission by an undesired amount. Embodiments in accordance with the present disclosure are not limited to EUV masks that include a first capping layer 120 that has a thickness from 0.5 to about 5 nm. Embodiments in accordance with the present disclosure include EUV masks that include a first capping layer 120 that has a thickness less than 0.5 nm and EUV masks that have a first capping layer 120 that has a thickness greater than about 5 nm.

In some embodiments, the first capping layer 120 is formed using a deposition process such as, for example, IBD, chemical vapor deposition (CVD), physical vapor deposition (PVD), atomic layer deposition (ALD), thermal ALD, PE-ALD, PECVD, E-beam evaporation, thermal evaporation, ion beam induced deposition, sputtering, electrodeposition, or electroless deposition.

Figure 3C:
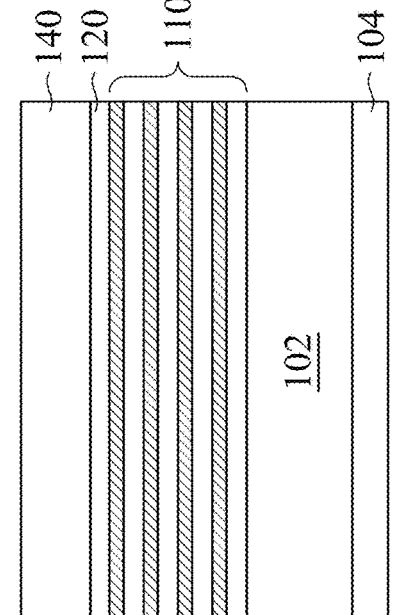

Referring to FIGS. 2 and 3C, the method 200 proceeds to operation 208, in which an absorber layer 140 is deposited over the first capping layer 120, in accordance with various embodiments. FIG. 3C is a cross-sectional view of the structure of FIG. 3B after depositing the absorber layer 140 over the first capping layer 120, in accordance with some embodiments.

Referring to FIG. 3C, the absorber layer 140 is disposed in direct contact with the first capping layer 120. The absorber layer 140 is usable to absorb radiation in the EUV wavelength projected onto the EUV mask 100.

The absorber layer 140 includes an absorber material having a high extinction coefficient k and a low refractive index n for EUV wavelengths. In some embodiments, the absorber layer 140 includes an absorber material having a high extinction coefficient and a low refractive index at 13.5 nm wavelength. In other embodiments, the absorber layer includes an absorber material having a low extinction coefficient and a high index of refraction for EUV radiation having a wavelength of 13.5 nm. In accordance with some embodiments of the present disclosure, the index of refraction and the extinction coefficient of the material of the absorber layer 140 are in relation to light having a wavelength of about 13.5 nm. In accordance with some embodiments, the thickness of absorber layer 140 is less than about 80 nm. In accordance with other embodiments, the thickness of absorber layer 140 is less than about 60 nm. Other embodiments utilize an absorber layer 140 that is less than about 50 nm.

In some embodiments, the absorber material is in a polycrystalline state characterized by grains, grain boundaries and different phases of formation. In other embodiments, the absorber material is in an amorphous state, e.g., characterized by grains on the order of less than 5 nanometers, less than 3 nanometers, less than 2 nanometers or no grain boundaries, and a single phase. In accordance with some embodiments of the present disclosure, the absorber material includes interstitial elements selected from nitrogen (N), oxygen (O), boron (B), carbon (C), or combinations thereof. As used herein, interstitial elements refer to elements which are located at interstices between materials comprising a main alloy and an alloying element of absorber materials formed in accordance with the present disclosure.

The absorber layer 140 is formed by deposition techniques such as PVD, CVD, ALD, RF magnetron sputtering, DC magnetron sputtering, or IBD. The deposition process can be carried out in the presence of elements described as interstitial elements, such as B or N. Carrying out the deposition in the presence of the interstitial elements results in the interstitial elements being incorporated into the material of the absorber layer 140.

In accordance with embodiments of the present disclosure, multiple combinations of different families of alloy materials are useful as absorber materials. Each of the different families of different alloys includes a main alloy element selected from a transition metal and at least one alloying element. In accordance with some embodiments, the main alloy element comprises up to 90 atomic percent of the alloy used as an absorber material. In some embodiments, the main alloy element comprises more than 50 atomic percent of the alloy used as an absorber material. In some embodiments, the main alloy element comprises about 50 to 90 atomic percent of the alloy used as an absorber material.

In accordance with some embodiments, the main alloy element is a transition metal selected from ruthenium (Ru), chromium (Cr), tantalum (Ta), platinum (Pt), gold (Au), iridium (Ir), titanium (Ti), niobium (Nb), rhodium (Rh), molybdenum (Mo), tungsten (W), and palladium (Pd). In accordance with some embodiments, the at least one alloying element is a transition metal, metalloid, or reactive nonmetal. Examples of the at least one alloying element that is a transition metal include ruthenium (Ru), chromium (Cr), tantalum (Ta), platinum (Pt), palladium (Pd), tungsten (W), gold (Au), iridium (Ir), titanium (Ti), niobium (Nb), rhodium (Rh), molybdenum (Mo), hafnium (Hf), zirconium (Zr), and vanadium (V). Examples of the at least one alloying element that is a metalloid include boron (B) and silicon (Si). Examples of the at least one alloying element that is a reactive nonmetal includes nitrogen (N) or oxygen (O).

Different materials may be used to etch the different absorber materials of the present disclosure and different materials may be used as a hard mask layer with the different absorber materials. For example, in some embodiments, the absorber layer 140 is dry etched with a gas that contains chlorine, such as $Cl_2$ or $BCl_3$, or with a gas that contains fluorine, such as $NF_3$. Ar may be used as a carrier gas. In some embodiments, oxygen ($O_2$) may also be included as the carrier gas. For example, a chlorine-based etchant, chlorine-based plus oxygen etchant, or a mixture of a chlorine-based and fluorine-based (e.g., carbon tetrafluoride and carbon tetrachloride) etchant will etch the alloys that include a main alloy element comprising ruthenium (Ru), chromium (Cr), tantalum (Ta), platinum (Pt) or gold (Au), and at least one alloying element selected from ruthenium (Ru), chromium (Cr), tantalum (Ta), platinum (Pt), palladium (Pd), tungsten (W), gold (Au), iridium (Ir), niobium (Nb), rhodium (Rh), molybdenum (Mo), hafnium (Hf) or vanadium (V). In some embodiments, a fluorine-based etchant is suitable to etch the alloys that include a main alloy element comprising iridium (Ir), titanium (Ti), niobium (Ni) or rhodium (Rh) and at least one alloying element selected from boron (B), nitrogen (N), oxygen (O), silicon (Si), tantalum (Ta), zirconium (Zr), niobium (Ni), molybdenum (Mo), rhodium (Rh), titanium (Ti) or ruthenium (Ru). In some embodiments, a fluorine-based or a fluorine-based plus oxygen etchant is suitable to etch the alloys that include a main alloy element comprising molybdenum (Mo), tungsten (W) or palladium (Pd) and at least one alloying element selected from ruthenium (Ru), palladium (Pd), tungsten (W), iridium (Ir), titanium (Ti), niobium (Nb), rhodium (Rh), molybdenum (Mo), silicon (Si) or zirconium (Zr).

In accordance with some embodiments, SiN, TaBO, TaO, SiO, SiON, and SiOB are examples of materials useful as hard mask layer 160 for absorber layer 140 utilizing alloys that include a main alloy element comprising ruthenium (Ru), chromium (Cr), tantalum (Ta), platinum (Pt) or gold (Au), and at least one alloying element selected from ruthenium (Ru), chromium (Cr), tantalum (Ta), platinum (Pt), palladium (Pd), tungsten (W), gold (Au), iridium (Ir), niobium (Nb), rhodium (Rh), molybdenum (Mo), hafnium (Hf) or vanadium (V). CrO and CrON are examples of materials useful for hard mask layer 160 for an absorber layer 140 that utilizes alloys that include a main alloy element comprising iridium (Ir), titanium (Ti), niobium (Ni) or rhodium (Rh) and at least one alloying element selected from boron (B), nitrogen (N), oxygen (O), silicon (Si), tantalum (Ta), zirconium (Zr), niobium (Ni), molybdenum (Mo), rhodium (Rh), titanium (Ti) or ruthenium (Ru). SiN, TaBO, TaO, CrO, and CrON are examples of materials useful for hard mask layer 160 for an absorber layer 140 that utilizes alloys that include a main alloy element comprising molybdenum (Mo), tungsten (W) or palladium (Pd) and at least one alloying element selected from ruthenium (Ru), palladium (Pd), tungsten (W), iridium (Ir), titanium (Ti), niobium (Nb), rhodium (Rh), molybdenum (Mo), silicon (Si) or zirconium (Zr). In other embodiments, there may be a buffer layer (not shown) similar in composition to the hard mask layer between the capping feature 125 and the layer 140 of absorber material. In some embodiments, the material of the hard mask layer 160 is the same or different from the material of the buffer layer. Embodiments in accordance with the present invention are not limited to the foregoing types of materials for hard mask layer 160 or the buffer layer.

In some embodiments, the absorber layer 140 is deposited as an amorphous layer. By maintaining an amorphous phase, the overall roughness of the absorber layer 140 is improved. The thickness of the absorber layer 140 is controlled to provide between 95% and 99.5% absorption of the EUV light at 13.5 nm. In some embodiments, the absorber layer 140 may have a thickness ranging from about 30 to 70 nm. Embodiments in accordance with the present disclosure include absorber layers having a thickness less than 30 nm and a thickness greater than 70 nm. If the thickness of the absorber layer 140 is too small, the absorber layer 140 is not able to absorb a sufficient amount of the EUV light to generate contrast between the reflective areas and non-reflective areas. On the other hand, if the thickness of the absorber layer 140 is too great, the precision of a pattern to be formed in the absorber layer 140 tends to be low.

Referring to FIGS. 2 and 3D, the method 200 proceeds to operation 210, in which a resist stack including a hard mask layer 160 and a photoresist layer 170 are deposited over the absorber layer 140, in accordance with some embodiments. FIG. 3E is a cross-sectional view of the structure of FIG. 3C after sequentially depositing the hard mask layer 160 and the photoresist layer 170 over the absorber layer 140, in accordance with some embodiments.

Referring to FIG. 3D, the hard mask layer 160 is disposed over the absorber layer 140. In some embodiments, the hard mask layer 160 is in direct contact with the absorber layer 140. In some embodiments, the hard mask layer 160 includes a dielectric oxide such as silicon dioxide or a dielectric nitride such as silicon nitride. In some embodiments, the hard mask layer 160 is formed using a deposition process such as, for example, CVD, PECVD, or PVD. In some embodiments, the hard mask layer 160 has a thickness ranging from about 2 to 10 nm. Embodiments in accordance with the present disclosure are not limited to hard mask layer 160 having a thickness ranging from about 2 to 10 nm.

The photoresist layer 170 is disposed over the hard mask layer 160. The photoresist layer 170 includes a photosensitive material operable to be patterned by radiation. In some embodiments, the photoresist layer 170 includes a positive-tone photoresist material, a negative-tone photoresist material or a hybrid-tone photoresist material. In some embodiments, the photoresist layer 170 is applied to the surface of the hard mask layer 160, for example, by spin coating.

Referring to FIGS. 2 and 3E, the method 200 proceeds to operation 212, in which the photoresist layer 170 is lithographically patterned to form a patterned photoresist layer 170P, in accordance with some embodiments. FIG. 3E is a cross-sectional view of the structure of FIG. 3D after lithographically patterning the photoresist layer 170 to form the patterned photoresist layer 170P, in accordance with some embodiments.

Referring to FIG. 3E, the photoresist layer 170 is patterned by first subjecting the photoresist layer 170 to a pattern of irradiation. Next, the exposed or unexposed portions of the photoresist layer 170 are removed, depending on whether a positive-tone or negative-tone resist is used in the photoresist layer 170, with a resist developer, thereby forming the patterned photoresist layer 170P having a pattern of openings 172 formed therein. The openings 172 expose portions of the hard mask layer 160. The openings 172 are located in the pattern region 100A and correspond to locations where the pattern of openings 152 are present in the EUV mask 100 (FIG. 1).

Figure 3F:
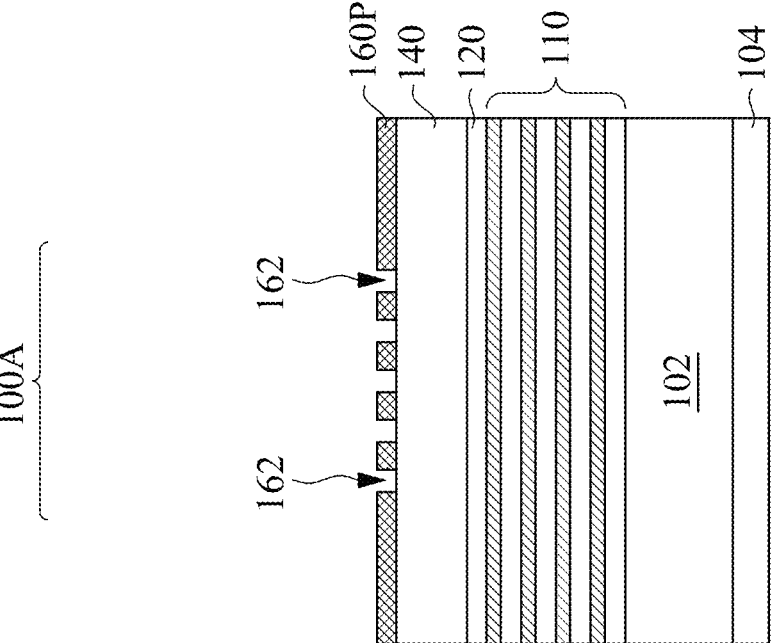
Figure 3E:
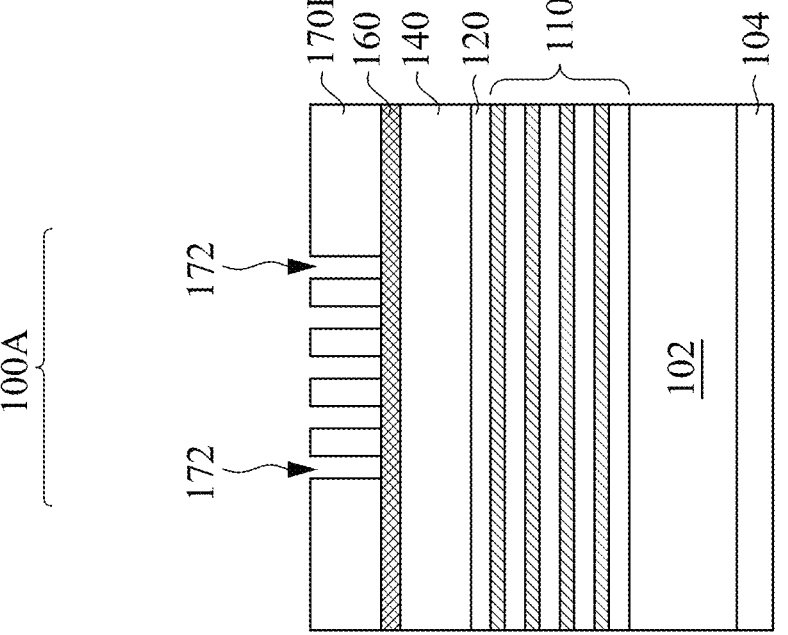

Referring to FIGS. 2 and 3F, the method 200 proceeds to operation 214, in which the hard mask layer 160 is etched using the patterned photoresist layer 170P as an etch mask to form a patterned hard mask layer 160P, in accordance with some embodiments. FIG. 3F is a cross-sectional view of the structure of FIG. 3E after etching the hard mask layer 160 to form the patterned hard mask layer 160P, in accordance with some embodiments.

Referring to FIG. 3F, portions of the hard mask layer 160 that are exposed by the openings 172 are etched to form openings 162 extending through the hard mask layer 160. The openings 162 expose portions of the underlying absorber layer 140. In some embodiments, the hard mask layer 160 is etched using an anisotropic etch using fluorine containing or chlorine containing gases such as $CF_4$, $SF_6$ or $Cl_2$. In some embodiments, the anisotropic etch is a dry etch such as, for example, reactive ion etch (RIE), a wet etch, or a combination thereof. The etch removes the material providing the hard mask layer 160 selective to the material providing the absorber layer 140. The remaining portions of the hard mask layer 160 constitute the patterned hard mask layer 160P. If not completely consumed during the etching of the hard mask layer 160, after etching the hard mask layer 160, the patterned photoresist layer 170P is removed from the surfaces of the patterned hard mask layer 160P, for example, using wet stripping or plasma ashing followed by a wet cleaning.

Figure 3H:
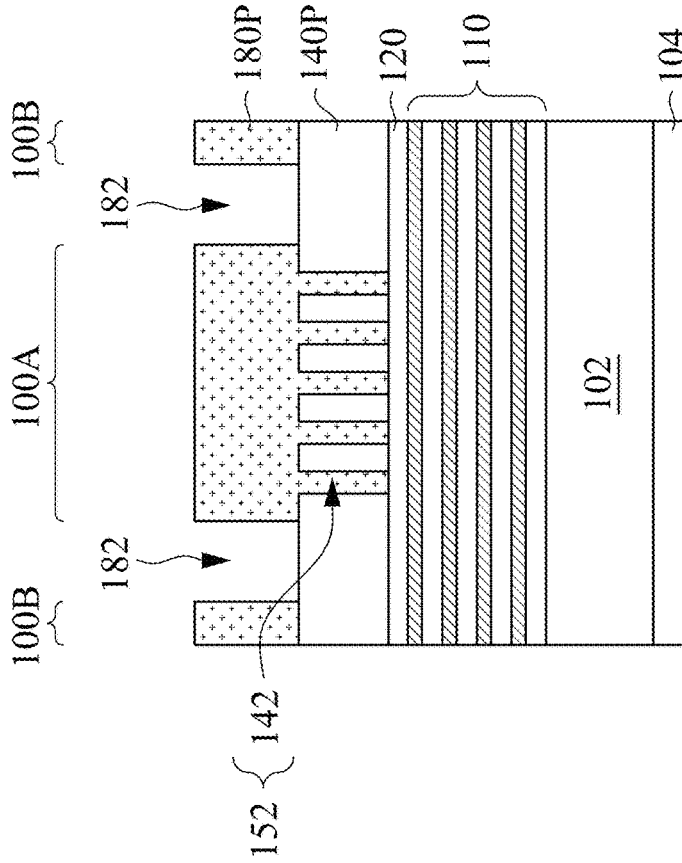
Figure 3G:
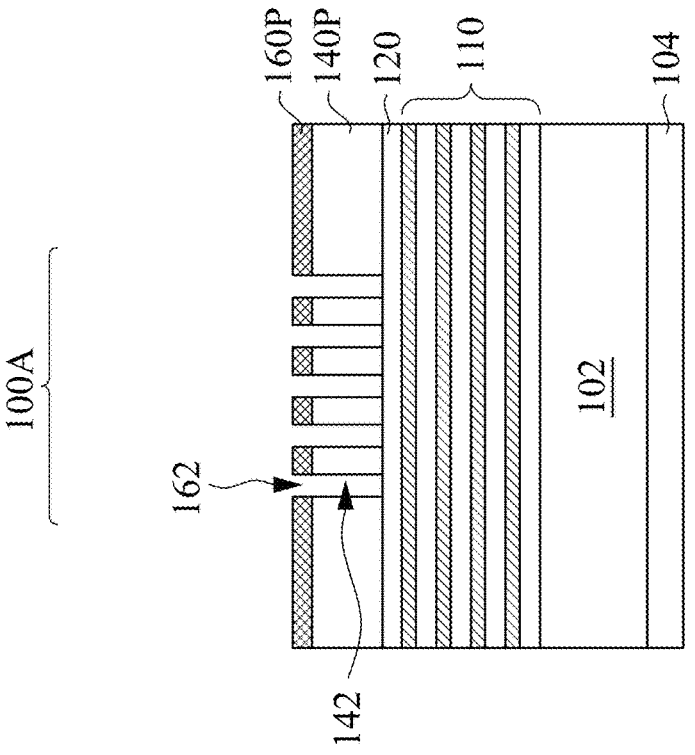

Referring to FIGS. 2 and 3G, the method 200 proceeds to operation 216, in which the absorber layer 140 is etched using the patterned hard mask layer 160P as an etch mask to form a patterned absorber layer 140P, in accordance with some embodiments. FIG. 3G is a cross-sectional view of the structure of FIG. 3E after etching the absorber layer 140 to form the patterned absorber layer 140P, in accordance with some embodiments.

Referring to FIG. 3G, portions of the absorber layer 140 that are exposed by the openings 162 are etched to form openings 142 extending through the absorber layer 140. The openings 142 expose portions of the first capping layer 120. In some embodiments, the absorber layer 140 is etched using an anisotropic etching process. In some embodiments, the anisotropic etch is a dry etch such as, for example, RIE, a wet etch, or a combination thereof that removes the material providing the absorber layer 140 selective to the material providing the underlying first capping layer 120. For example, in some embodiments, the absorber layer 140 is dry etched with a gas that contains chlorine, such as $Cl_2$ or $BCl_3$, or with a gas that contains fluorine, such as $CF_4$, $SF_3$ or $NF_3$. Ar may be used as a carrier gas. In some embodiments, oxygen $(O_2)$ may also be included as the carrier gas. The etch rate and the etch selectivity depend on the etchant gas, etchant flow rate, power, pressure, and substrate temperature. After etching, the remaining portions of the absorber layer 140 constitute the patterned absorber layer 140P. In accordance with embodiments of the present disclosure, when absorber layer 140 includes multiple layers of absorber material, when the individual layers of absorber material have differential etching properties, the individual layers of absorber material may be etched individually using different etchants. When the individual layers of absorber material do not have differential etching properties, the individual layers of absorber material may be etched simultaneously.

In some embodiments, etching of absorber layer 140 also removes a portion of the first capping layer 120. In other embodiments, etching of absorber layer 140 does not remove any of the first capping layer 120. The openings 142 expose portions of the underlying first capping layer 120 at the bottom of trenches formed in the absorber layer 140. After etching the absorber layer 140, the patterned hard mask layer 160P is removed from the surfaces of the patterned absorber layer 140P, for example, using oxygen plasma or a wet etch.

The openings 142 in the patterned absorber layer 140P define the pattern of openings 152 in the EUV mask 100. In accordance with embodiments of the present disclosure, the portions of first capping layer 120 that are exposed through patterned absorber layer 140 exhibit a reduced susceptibility to deposition or contamination with carbon. In addition, owing to the amorphous structure of the material of first capping layer 120, first capping layer 120 resists weakening by etchants, cleaners or processes using such etchants or cleaners that are carried out during the manufacture of the EUV mask 100. Such resistance to weakening by etchants, cleaners or processes using such etchants or cleaners not only increases the lifetime of the mask, but also increases the ability of the first capping layer 120 to resist infiltration by oxidants which can react with the underlying reflective multilayer stack to form unwanted oxides.

Referring to FIGS. 2 and 3H, the method 200 proceeds to operation 220, in which a patterned photoresist layer 180P comprising a pattern of openings 182 is formed over the patterned absorber layer 140P and the first capping layer 120, in accordance with some embodiments. FIG. 3H is a cross-sectional view of the structure of FIG. 3G after forming the patterned photoresist layer 180P comprising openings 182 over the patterned absorber layer 140P and the first capping layer 120, in accordance with some embodiments.

Referring to FIG. 3H, the openings 182 expose portions of the patterned absorber layer 140P at the periphery of the patterned absorber layer 140P. The openings 182 correspond to the trenches 154 in the peripheral region 100B of the EUV mask 100 that are to be formed. To form the patterned photoresist layer 180P, a photoresist layer (not shown) is applied over the first capping layer 120 and the patterned absorber layer 140P. The photoresist layer fills the openings 142 in the patterned absorber layer 140P, respectively. In some embodiments, the photoresist layer includes a positive-tone photoresist material, a negative-tone photoresist material, or a hybrid-tone photoresist material. In some embodiments, the photoresist layer includes a same material as the photoresist layer 170 described above in FIG. 3D. In some embodiments, the photoresist layer includes a different material from the photoresist layer 170. In some embodiments, the photoresist layer is formed, for example, by spin coating. A photoresist layer is subsequently patterned by exposing the photoresist layer to a pattern of radiation, and removing the exposed or unexposed portions of the photoresist layer using a resist developer depending on whether a positive or negative resist is used. The remaining portions of the photoresist layer constitute the patterned photoresist layer 180P.

Figures 3I, 3J:
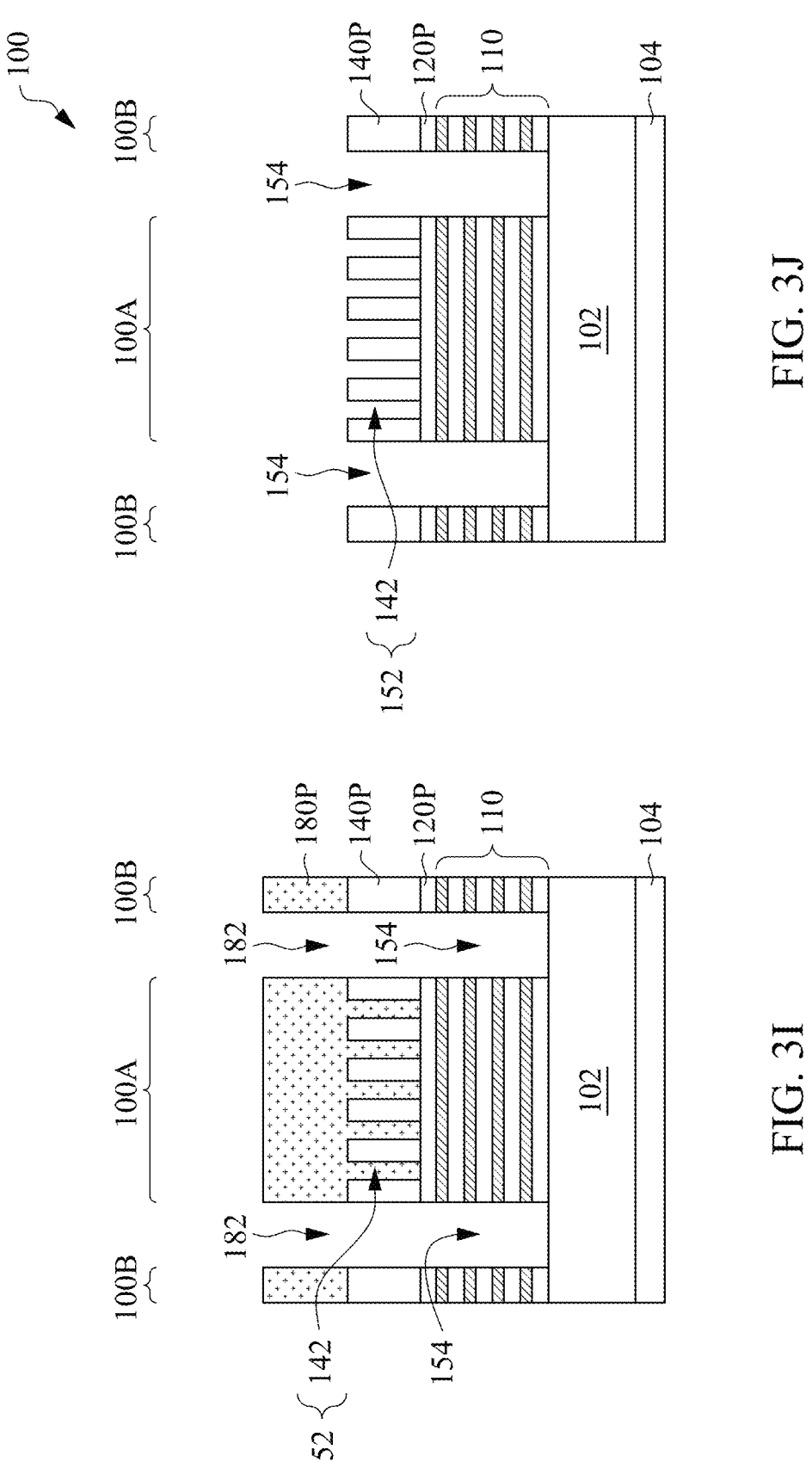

Referring to FIGS. 2 and 3I, the method 200 proceeds to operation 222, in which the patterned absorber layer 140P, the first capping layer 120, and the reflective multilayer stack 110 are etched using the patterned photoresist layer 180P as an etch mask to form trenches 154 in the peripheral region 100B of the substrate 102, in accordance with some embodiments. FIG. 3I is a cross-sectional view of the structure of FIG. 3H after etching the patterned absorber layer 140P, the first capping layer 120, and the reflective multilayer stack 110, to form the trenches 154 in the peripheral region 100B of the substrate 102, in accordance with some embodiments.

Referring to FIG. 3I, the trenches 154 extend through the patterned absorber layer 140P, the first capping layer 120, and the reflective multilayer stack 110 to expose the surface of the substrate 102. The trenches 154 surround the pattern region 100A of the EUV mask 100, separating the pattern region 100A from the peripheral region 100B.

In some embodiments, the patterned absorber layer 140P, the first capping layer 120, and the reflective multilayer stack 110 are etched using a single anisotropic etching process. The anisotropic etch can be a dry etch such as, for example, RIE, a wet etch, or a combination thereof that removes materials of the respective patterned absorber layer 140P, the first capping layer 120, and the reflective multilayer stack 110, selective to the material providing the substrate 102. In some embodiments, the patterned absorber layer 140P, the first capping layer 120, and the reflective multilayer stack 110 are etched using multiple distinct anisotropic etching processes. Each anisotropic etch can be a dry etch such as, for example, RIE, a wet etch, or a combination thereof.

Referring to FIGS. 2 and 3J, the method 200 proceeds to operation 224, in which the patterned photoresist layer 180P is removed, in accordance with some embodiments. FIG. 3J is a cross-sectional view of the structure of FIG. 3I after removing the patterned photoresist layer 180P, in accordance with some embodiments.

Referring to FIG. 3J, the patterned photoresist layer 180P is removed from the pattern region 100A and the peripheral region 100B of the substrate 102, for example, by wet stripping or plasma ashing. The removal of the patterned photoresist layer 180P from the openings 142 in the patterned absorber layer 140P re-exposes the surfaces of the first patterned capping layer 120P in the pattern region 100A.

An EUV mask 100 is thus formed. The EUV mask 100 includes a substrate 102, a reflective multilayer stack 110 over a front surface of the substrate 102, a first patterned capping layer 120P over the reflective multilayer stack 110 and a patterned absorber layer 140P over the first patterned capping layer 120P. The EUV mask 100 further includes a conductive layer 104 over a back surface of the substrate 102 opposite the front surface. In accordance with embodiments of the present disclosure, the first capping layer 120 protects the EUV mask from carbon contamination by reducing or preventing deposition, formation or absorption of carbon onto exposed surfaces of the first capping layer 120. As a result, the detrimental effects (e.g., need for increased EUV energy or negative effects on CDU) from carbon formation on or carbon contamination of an EUV mask are reduced or prevented and a pattern on the EUV mask 100 can be projected precisely onto a silicon wafer. Owing to the amorphous structure of the material of first capping layer 120, first capping layer 120 resists weakening by etchants, cleaners or processes using such etchants or cleaners that are carried out during the manufacture of the EUV mask 100. Such resistance to weakening by etchants, cleaners or processes using such actions or cleaners increases the ability of the first capping layer 120 resist infiltration by oxidants which can react with the underlying reflective multilayer stack to form unwanted oxides.

After removal of the patterned photoresist layer 180P, the EUV mask 100 is cleaned to remove any contaminants therefrom. In some embodiments, the EUV mask 100 is cleaned by submerging the EUV mask 100 into an ammonium hydroxide ($NH_4OH$) solution. In some embodiments, the EUV mask 100 is cleaned by submerging the EUV mask 100 into a diluted hydrofluoric acid (HF) solution.

The EUV mask 100 is subsequently radiated with, for example, a UV light with a wavelength of 193 nm, for inspection of any defects in the pattern region 100A. The foreign matters may be detected from diffusely reflected light. If defects are detected, the EUV mask 100 is further cleaned using suitable cleaning processes.

Figure 4:
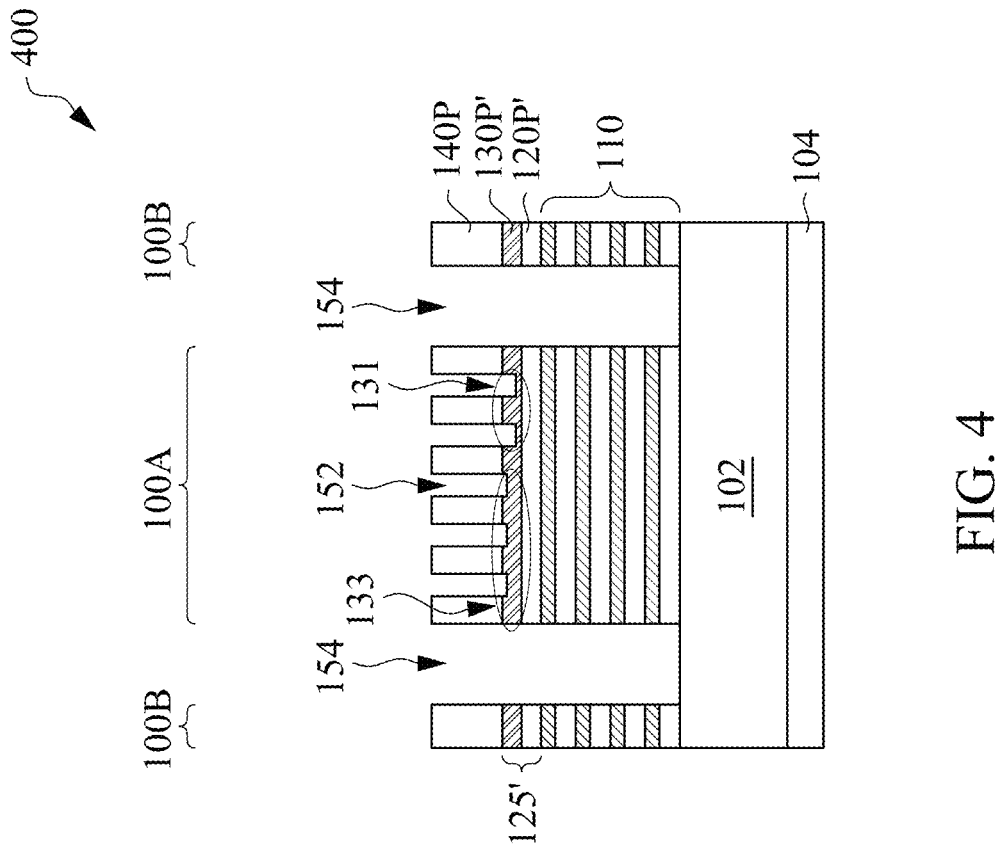
FIG. 4 is a cross-sectional view of an extreme ultraviolet (EUV) mask, in accordance with a second embodiment.

FIG. 4 is a cross-sectional view of an EUV mask 400, in accordance with a second embodiment of the present disclosure. EUV mask 400 is similar in some regards to EUV mask 100 described above with respect to FIGS. 1-3. EUV mask 400 differs from EUV mask 100 in that EUV mask 400 includes a multilayer capping feature that includes two or more capping layers as described below in more detail. Structures and features which are common between EUV mask 400 and EUV mask 100 are identified by the same reference numerals and the description above applies to those features. Referring to FIG. 4, the EUV mask 400 includes a substrate 102, a reflective multilayer stack 110 over a front surface of the substrate 102, a first patterned capping layer 120P' over the reflective multilayer stack 110, a patterned second capping layer 130P' and a patterned absorber layer 140P over the second patterned capping layer 130P'. The composition of patterned first capping layer 120P' of EUV mask 400 differs from the composition of patterned second capping layer 130P'. In accordance with embodiments of the present disclosure relative to FIG. 4, the description above regarding the composition or material of the first capping layer 120 applies to the patterned first capping layer 120P' and the patterned second capping layer 130P'. In other words, the materials of first patterned capping layer 120P' and second patterned capping layer 130P' can be selected from the materials described above for use in the first capping layer 120 of the embodiments of FIGS. 1-3. The EUV mask 400 further includes a conductive layer 104 over a back surface of the substrate 102 opposite the front surface. While the embodiment of FIG. 4 is illustrated and described with reference to a multilayered capping feature 125' that includes two capping layers, embodiments of the present disclosure include EUV masks that include a multilayered capping feature including more than two capping layers, e.g., three, four or more capping layers.

Figure 5:
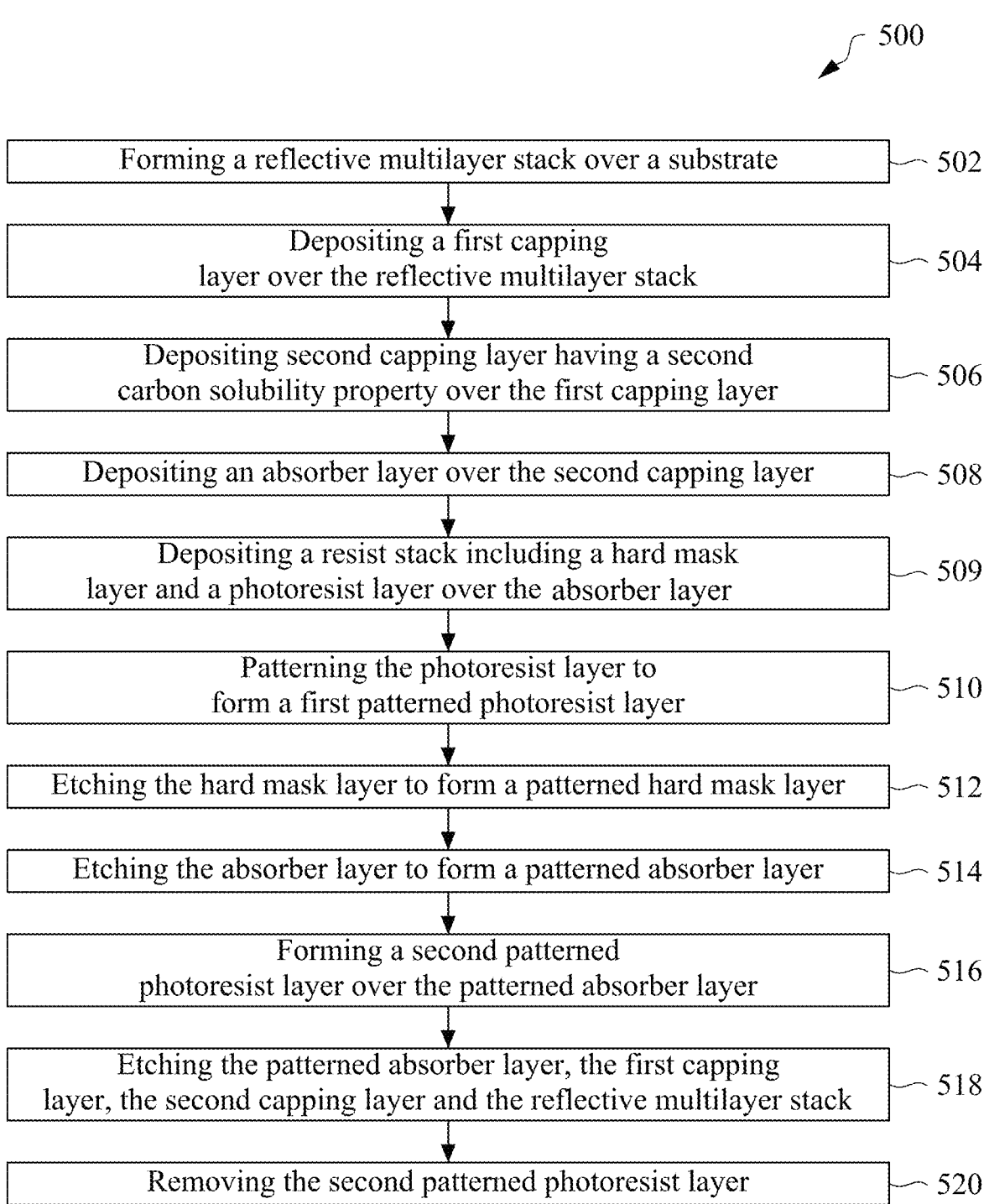
FIG. 5 is a flowchart of a method for fabricating the EUV mask of FIG. 4, in accordance with some embodiments.

FIG. 5 is a flowchart of a method 500 for fabricating an EUV mask, for example, EUV mask 400, in accordance with some embodiments. FIG. 6A through FIG. 6L are cross-sectional views of the EUV mask 400 at various stages of the fabrication process, in accordance with some embodiments. The method 500 is discussed in detail below, with reference to the EUV mask 400. In some embodiments, additional operations are performed before, during, and/or after the method 500, or some of the operations described are replaced and/or eliminated. In some embodiments, some of the features described below are replaced or eliminated. One of ordinary skill in the art would understand that although some embodiments are discussed with operations performed in a particular order, these operations may be performed in another logical order.

Figure 6B:
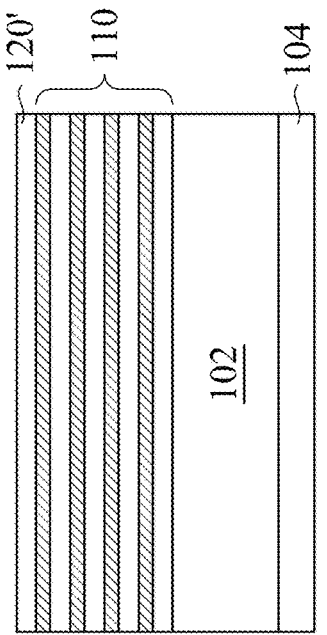
FIGS. 6A-6L are cross-sectional views of an EUV mask at various stages of the fabrication process of FIG. 5, in accordance with some embodiments.
Figure 6A:
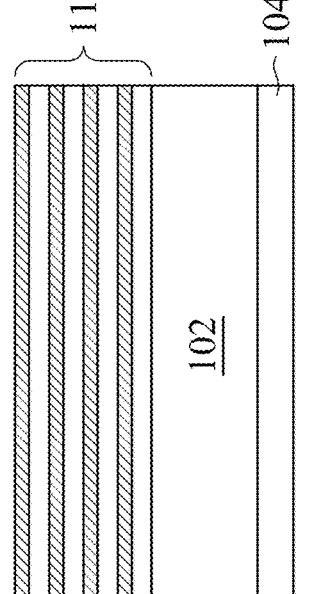

Referring to FIGS. 5 and 6A, the method 500 includes operation 502, in which a reflective multilayer stack 110 is formed over a substrate 102, in accordance with some embodiments. FIG. 6A is a cross-sectional view of an initial structure of an EUV mask 400 after forming the reflective multilayer stack 110 over the substrate 102, in accordance with some embodiments. The materials and formation processes for the reflective multilayer stack 110 are similar to those described above in FIG. 3A, and hence are not described in detail herein.

Referring to FIGS. 5 and 6B, the method 500 proceeds to operation 504, in which a first capping layer 120' is deposited over the reflective multilayer stack 110, in accordance with some embodiments. FIG. 6B is a cross-sectional view of the structure of FIG. 6A after depositing the first capping layer 120' over the reflective multilayer stack 110, in accordance with some embodiments. The materials and formation processes for the first capping layer 120' are similar to those described above with respect to the materials and formation of first capping layer 120 in FIG. 3B, and hence are not described in detail herein.

Figure 6D:
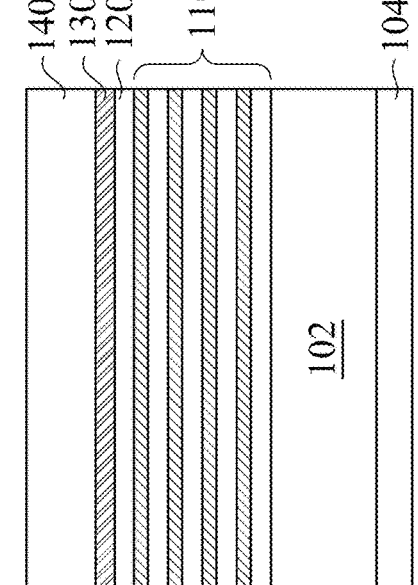
Figure 6C:
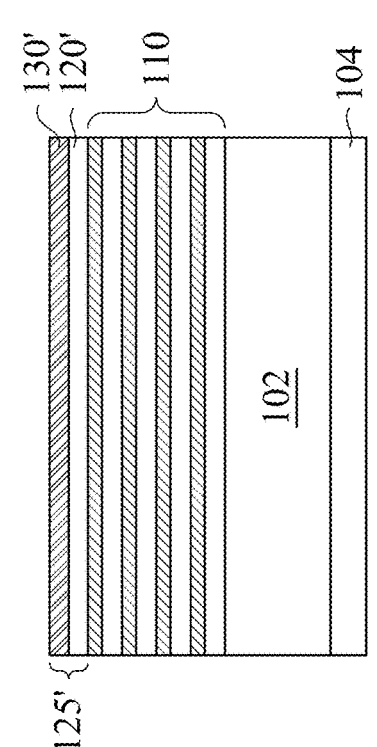

Referring to FIGS. 5 and 6C, the method 500 proceeds to operation 506, in which a second capping layer 130' is deposited over the first capping layer 120', in accordance with some embodiments. FIG. 6C is a cross-sectional view of the structure of FIG. 6B after depositing the second capping layer 130' over the first capping layer 120', in accordance with some embodiments. In the embodiment of FIG. 6C, first capping layer 120' and second capping layer 130' comprise the multilayered capping feature 125'.

Referring to FIG. 6C, the second capping layer 130' is disposed on the first capping layer 120'. In some embodiments, the second capping layer 130' possesses different etching characteristics from an absorber layer subsequently formed thereon, and thereby may serve as an etch stop layer to prevent damages to the first capping layer 120' during patterning of an absorber layer. Further, the second capping layer 130' may also serve later as a sacrificial layer for focused ion beam repair of defects in the absorber layer. In some embodiments the second capping layer 130' is selected from one of the materials described above as being useful as a material for first capping layer 120 in the embodiments of FIGS. 1-3. For example, the material of the second capping layer 130' includes an element having an extinction coefficient K ranging between 0 and 0.1 and a refractive index n between 0.87 and 0.97 relative to EUV wavelengths. With a material having an extinction coefficient K and a refractive index n in these ranges, the material of the second capping layer 130' is able to transmit a desired level of incident EUV light and not affect the phase of the incident EUV light in an undesirable way.

In some embodiments, the second capping layer 130' is deposited by thermal ALD, PE-ALD, CVD, PECVD, PVD E-beam evaporation, thermal evaporation, ion beam induced deposition, sputtering, electrodeposition, or electroless deposition. In some embodiments, the second capping layer has a thickness ranging from about 0.5 to 5 nm. Second capping layer 130' having a thickness ranging from about 0.5 to 5 nm has a thickness that is sufficient to protect the underlying first capping layer 120' and/or multilayer stack 110 from oxidants or chemical etchants during the mask formation process or semiconductor process using the mask. When second capping layer 130' is 0.5 to 5 nm thick it is not so thick as to reduce EUV transmission by an undesired amount. Embodiments in accordance with the present disclosure are not limited to EUV masks that include a second capping layer 130' that has a thickness from 0.5 to about 5 nm. Embodiments in accordance with the present disclosure include EUV masks that include a second capping layer 130' that has a thickness less than 0.5 nm and EUV masks that have a second capping layer 130' that has a thickness greater than about 5 nm.

In some embodiments, the material of the second capping layer 130' includes elements that have a solid carbon solubility that is different from elements in the material of the first capping layer 120'. For example in some embodiments, the solid carbon solubility of the element of the material of the second capping layer 130' is greater than or less than the solid carbon solubility of the material of the first capping layer 120'. In accordance with some embodiments of FIG. 4, the material of the second capping layer 130' includes an element that has an EUV extinction coefficient that is less than an EUV extinction coefficient of an element in the material of another layer, e.g., first capping layer 120' of the multilayered capping feature 125'. In other embodiments of FIG. 4, the element of the material of the second capping layer 130' has an EUV extinction coefficient for EUV radiation having a wavelength of 13.5 nm that is greater than an EUV extinction coefficient for EUV radiation having a wavelength of 13.5 nm of an element of the material of the first capping layer 120' of the multilayered capping feature 125'. In addition, the materials for use in second capping layer 130' of the multilayered capping features in accordance with the present embodiment exhibit good adhesion to first capping layer 120', as well as materials which are deposited onto the second capping layer 130'.

The formation processes for the second capping layer 130' are similar to those described above with respect to the formation of first capping layer 120 in FIG. 3B, and hence are not described in detail here.

Referring to FIGS. 5 and 6D, the method 500 proceeds to operation 508, in which an absorber layer 140 is deposited over the second capping layer 130', in accordance with various embodiments. FIG. 6D is a cross-sectional view of the structure of FIG. 6C after depositing the absorber layer 140 over the second capping layer 130', in accordance with some embodiments. The materials and formation processes for the absorber layer 140 are similar to those described above in FIG. 3C, and hence are not described in detail herein.

Figure 6F:
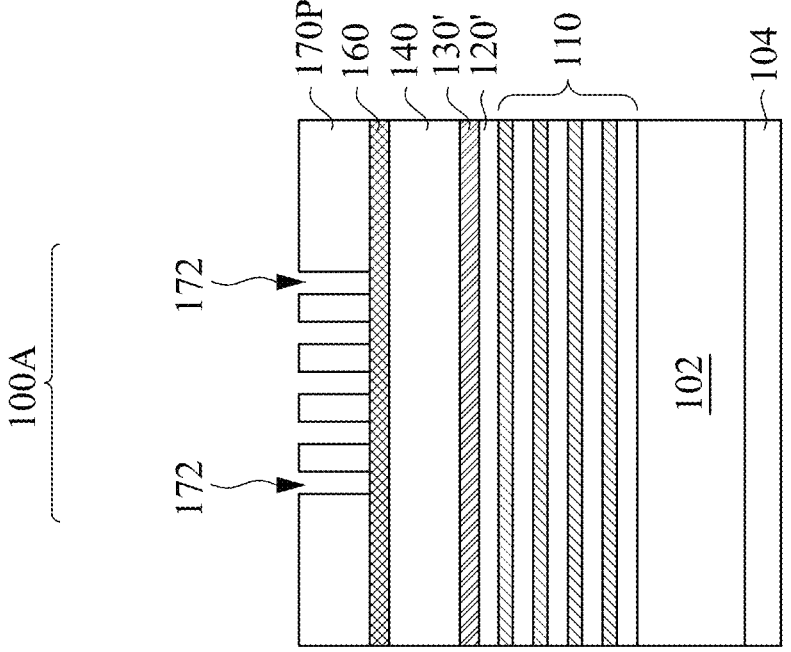
Figure 6E:
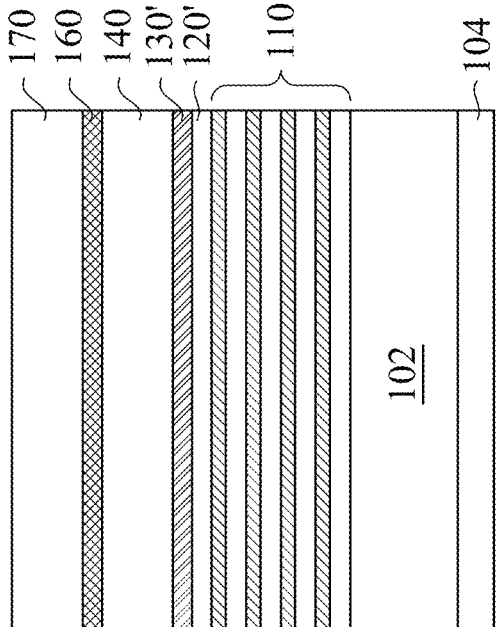

Referring to FIGS. 5 and 6E, the method 500 proceeds to operation 509, in which a resist stack including a hard mask layer 160 and a photoresist layer 170 is deposited over the absorber layer 140, in accordance with some embodiments. FIG. 6E is a cross-sectional view of the structure of FIG. 6D after sequentially depositing the hard mask layer 160 and the photoresist layer 170 over the absorber layer 140, in accordance with some embodiments. Materials and formation processes for respective hard mask layer 160 and photoresist layer 170 are similar to those described in FIG. 3D, and hence are not described in detail herein.

Referring to FIGS. 5 and 6F, the method 500 proceeds to operation 510, in which the photoresist layer 170 is lithographically patterned to form a patterned photoresist layer 170P, in accordance with some embodiments. FIG. 6F is a cross-sectional view of the structure of FIG. 6E after lithographically patterning the photoresist layer 170 to form the patterned photoresist layer 170P, in accordance with some embodiments. Etching processes for the photoresist layer 170 are similar to those described in FIG. 3E, and hence are not described in detail herein.

Figure 6H:
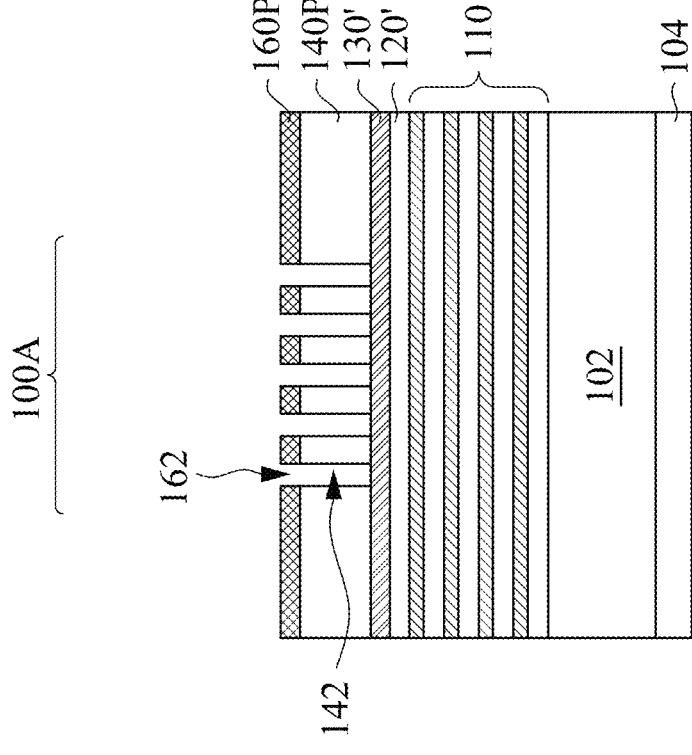
Figure 6G:
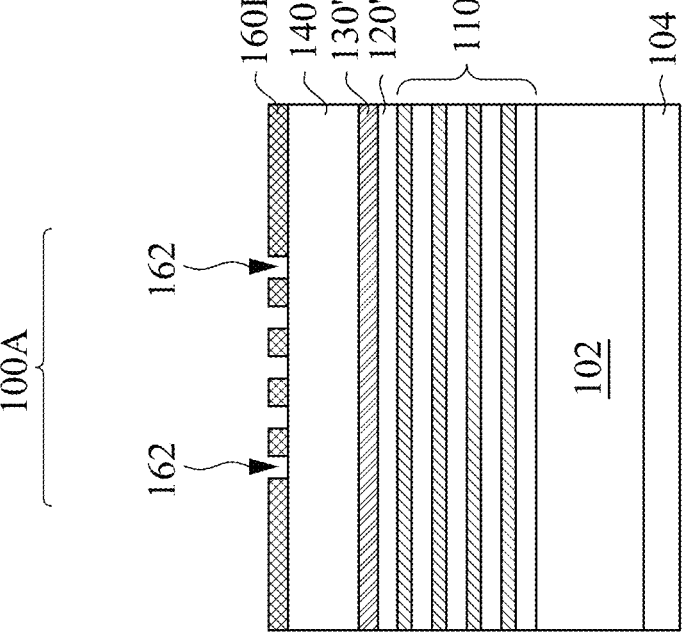

Referring to FIGS. 5 and 6G, the method 500 proceeds to operation 512, in which the hard mask layer 160 is etched using the patterned photoresist layer 170P as an etch mask to form a patterned hard mask layer 160P, in accordance with some embodiments. FIG. 6G is a cross-sectional view of the structure of FIG. 6F after etching the hard mask layer 160 to form the patterned hard mask layer 160P, in accordance with some embodiments. Etching processes for the hard mask layer 160 are similar to those described in FIG. 3F, and hence are not described in detail herein.

Referring to FIGS. 5 and 6H, the method 500 proceeds to operation 514, in which the absorber layer 140 is etched using the patterned hard mask layer 160P as an etch mask to form a patterned absorber layer 140P, in accordance with some embodiments. FIG. 6H is a cross-sectional view of the structure of FIG. 6G after etching the absorber layer 140 to form the patterned absorber layer 140P, in accordance with some embodiments. Etching processes for the absorber layer 140 are similar to those described in FIG. 3G, and hence are not described in detail herein. The patterned absorber layer 140P includes a plurality of openings 142 that expose the underlying second capping layer 130'. After etching the absorber layer 140, the patterned hard mask layer 160P is removed from the surfaces of the patterned absorber layer 140P, for example, using oxygen plasma or a wet etch. The resulting structure is illustrated in FIG. 6I.

In some embodiments in accordance with FIGS. 4-6, the steps of etching absorber layer 140 to form patterned absorber layer 140P and/or the step of removing the photoresist layer 170 and/or patterned hard mask layer 160P can remove portions of an upper surface of second capping layer 130'. Such embodiments are illustrated in FIG. 4 by reference number 131 where a portion of patterned second capping layer 130P' is removed by the step of etching absorber layer 140 or the step of removing the photoresist layer 170 and/or patterned hard mask layer 160P. In accordance with embodiments where a portion of an upper surface of patterned second capping layer 130P' is removed, an amount of the upper surface of patterned second capping layer 130P' remains, e.g., at least a few nanometers of patterned second capping layer 130P' remains. Examples of a few nanometers includes 1 to 2 nm. In other embodiments in accordance with FIGS. 4-6, the steps of etching absorber layer 140 to form patterned absorber layer 140P and/or the step of removing the photoresist layer 170 and/or patterned hard mask layer 160P do not remove portions of second capping layer 130'. Such embodiments are illustrated in FIG. 4 by reference number 133. FIG. 6I illustrates an embodiment wherein none of second capping layer 130' has been removed by the absorber layer, photoresist or hard mask removal steps.

Figure 6J:
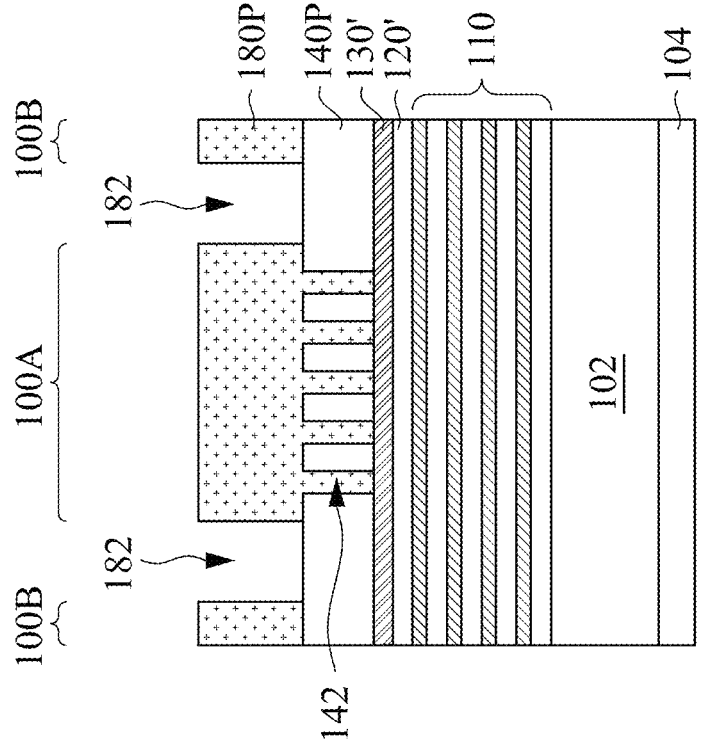
Figure 6I:
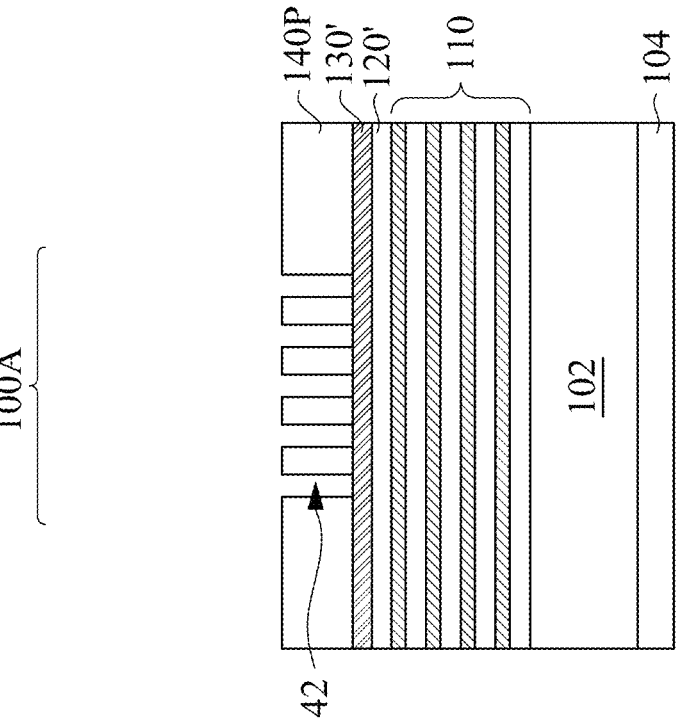

Referring to FIGS. 5 and 6J, the method 500 proceeds to operation 516, in which a patterned photoresist layer 180P comprising a pattern of openings 182 is formed over the patterned absorber layer 140P and second capping layer 130', in accordance with some embodiments. FIG. 6J is a cross-sectional view of the structure of FIG. 6I after forming the patterned photoresist layer 180P comprising openings 182 over the patterned absorber layer 140P and second capping layer 130', in accordance with some embodiments. Materials and fabrication processes for the patterned photoresist layer 180P are similar to those described in FIG. 3H, and hence are not described in detail herein.

Figures 6K, 6L:
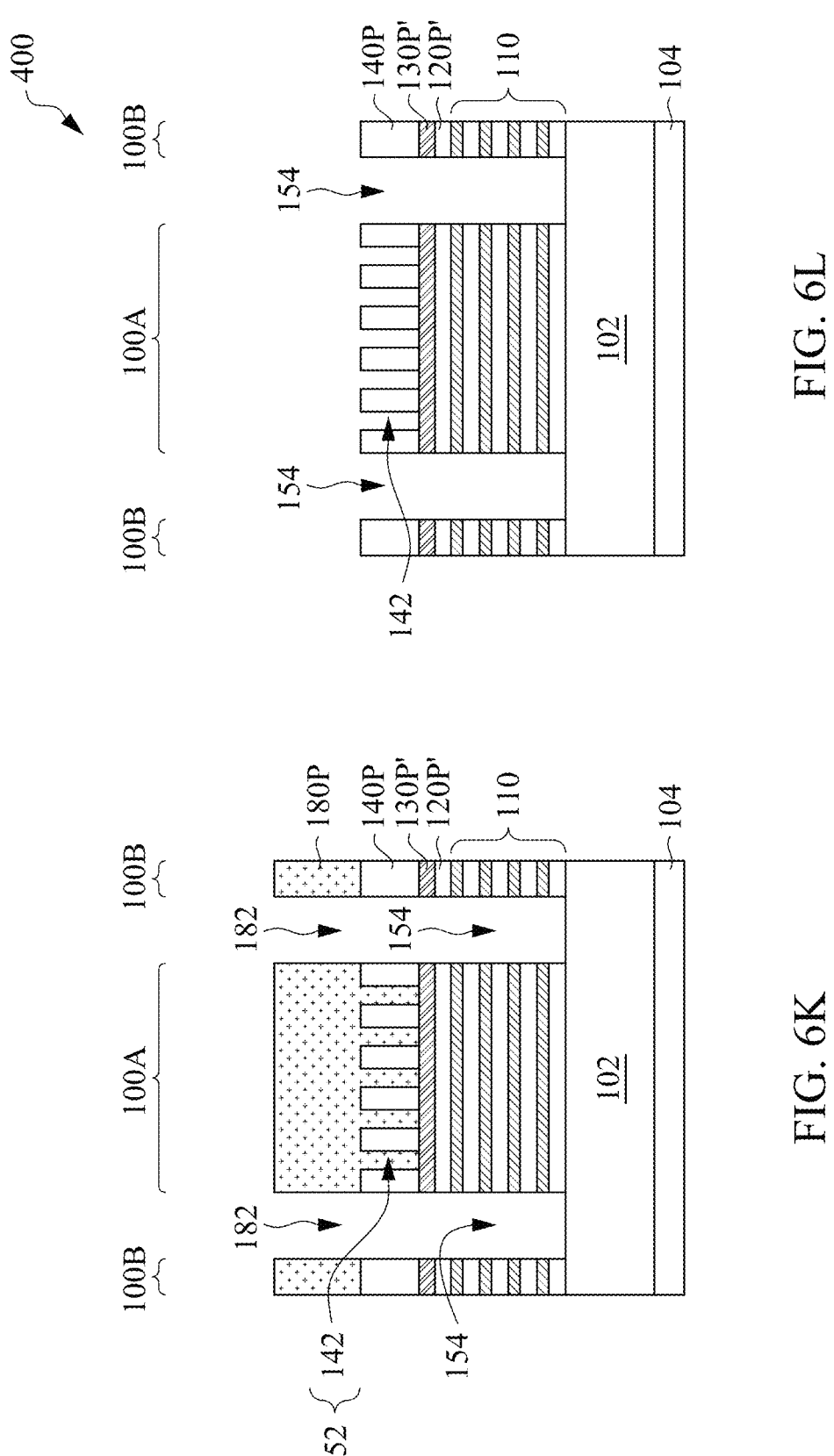

Referring to FIGS. 5 and 6K, the method 500 proceeds to operation 518, in which the patterned absorber layer 140P, the second capping layer 130', the first capping layer 120', and the reflective multilayer stack 110 are etched using the patterned photoresist layer 180P as an etch mask to form trenches 154 in the peripheral region 100B of the substrate 102, in accordance with some embodiments. FIG. 6K is a cross-sectional view of the structure of FIG. 6J after etching the patterned absorber layer 140P, the second capping layer 130', the first capping layer 120' and the reflective multilayer stack 110, to form the trenches 154 in the peripheral region 100B of the substrate 102, in accordance with some embodiments.

Referring to FIG. 6K, the trenches 154 extend through the patterned absorber layer 140P, the second capping layer 130', the first capping layer 120' and the reflective multilayer stack 110 to expose the surface of the substrate 102. The trenches 154 surround the pattern region 100A of the EUV mask 400, separating the pattern region 100A from the peripheral region 100B.

In some embodiments, the patterned absorber layer 140P, the second capping layer 130', the first capping layer 120', and the reflective multilayer stack 110 are etched using a single anisotropic etching process. The anisotropic etch can be a dry etch such as, for example, RIE, a wet etch, or a combination thereof that removes materials of the respective patterned absorber layer 140P, the second capping layer 130', the first capping layer 120' and the reflective multilayer stack 110, selective to the material providing the substrate 102. In some embodiments, the patterned absorber layer 140P, the second capping layer 130', the first capping layer 120' and the reflective multilayer stack 110 are etched using multiple distinct anisotropic etching processes. Each anisotropic etch can be a dry etch such as, for example, RIE, a wet etch, or a combination thereof.

Referring to FIGS. 5 and 6L, the method 500 proceeds to operation 520, in which the patterned photoresist layer 180P is removed, in accordance with some embodiments. FIG. 6L is a cross-sectional view of the structure of FIG. 6K after removing the patterned photoresist layer 180P, in accordance with some embodiments.

Referring to FIG. 6L, the patterned photoresist layer 180P is removed from the pattern region 100A and the peripheral region 100B of the substrate 102, for example, by wet stripping or plasma ashing. The removal of the patterned photoresist layer 180P from the openings 142 in the patterned absorber layer 140P re-exposes the surfaces of the second patterned capping layer 130' in the pattern region 100A. The openings 142 in the patterned absorber layer 140P define the pattern of openings in the EUV mask 400 that correspond to circuit patterns to be formed on a semiconductor wafer.

An EUV mask 400 is thus formed. The EUV mask 400 includes a substrate 102, a reflective multilayer stack 110 over a front surface of the substrate 102, a first patterned capping layer 120P' over the reflective multilayer stack 110, a second patterned capping layer 130P' over the first patterned capping layer 120P' and a patterned absorber layer 140P over the second patterned capping layer 130P'. The EUV mask 400 further includes a conductive layer 104 over a back surface of the substrate 102 opposite the front surface. In accordance with embodiments of FIGS. 4-6, the second capping layer 130' is resistant to carbon contamination and thereby protects the underlying first capping layer 120' and reflective multilayer stack 110 from carbon contamination by reducing or preventing deposition, formation or absorption of carbon onto exposed surfaces of the second capping layer 130'. As a result, the detrimental effects (e.g., need for increased EUV energy or negative effects on CDU) from carbon formation on or carbon contamination of an EUV mask are reduced or prevented and a pattern on the EUV mask 400 can be projected precisely onto a silicon wafer. Owing to the amorphous structure of the material of first capping layer 120' and/or second capping layer 130', first capping layer 120' and/or second capping layer 130' resist weakening by etchants, cleaners or processes using such etchants or cleaners that are carried out during the manufacture of the EUV mask 400. Such resistance to weakening by etchants, cleaners or processes using such etchants or cleaners increases the ability of the first capping layer 120' and second capping layer 130' to resist infiltration by oxidants which can react with the underlying reflective multilayer stack to form unwanted oxides.

After removal of the patterned photoresist layer 180P, the EUV mask 400 is cleaned to remove any contaminants therefrom. In some embodiments, the EUV mask 400 is cleaned by submerging the EUV mask 400 into an ammonium hydroxide ($NH_4OH$) solution. In some embodiments, the EUV mask 400 is cleaned by submerging the EUV mask 400 into a diluted hydrofluoric acid (HF) solution.

The EUV mask 400 is subsequently radiated with, for example, a UV light with a wavelength of 193 nm, for inspection of any defects in the pattern region 100A. The foreign matters may be detected from diffusely reflected light. If defects are detected, the EUV mask 400 is further cleaned using suitable cleaning processes.

Figure 7:
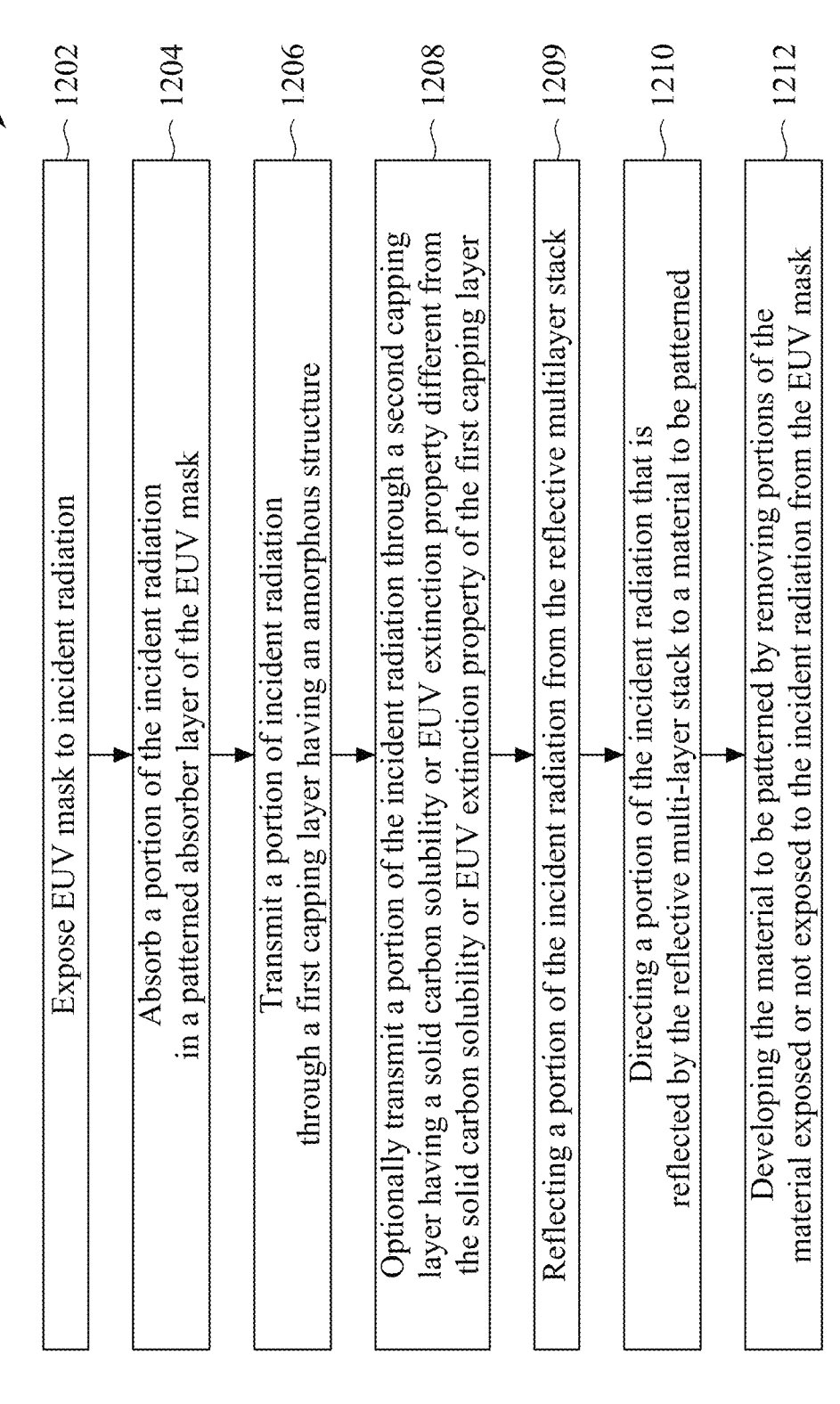
FIG. 7 is a flowchart of a method of using an EUV mask in accordance with some embodiments.

FIG. 7 illustrates a method 1200 of using an EUV mask in accordance with embodiments of the present disclosure. Method 1200 includes step 1202 of exposing an EUV mask to an incident radiation, e.g., EUV radiation. An example of an EUV mask useful in step 1202 includes the EUV masks 100 or 400 described above. At step 1204, a portion of the incident radiation is absorbed in a patterned absorber layer of the EUV mask. At step 1206, a portion of the incident radiation is transmitted through a capping layer having an amorphous structure. An example of a capping layer having an amorphous structure includes the first capping layer 120 described with reference to FIGS. 1-3. At optional step 1208 which relates to a method employing a multilayer capping feature in accordance with embodiments of the present disclosure, a portion of the incident radiation is transmitted through a second capping layer having a second solid carbon solubility or second EUV extinction property that is different from the first carbon solubility or first EUV extinction property of the first capping layer. Examples of capping layers having a second solid carbon solubility or second EUV extinction property include the first capping layer 120' or the second capping layer 130' described above. At step 1209, a portion of the incident radiation is reflected from the reflective multilayer stack. A portion of the incident radiation that is reflected by the reflective multilayer stack is directed to a material to be patterned in step 1210. In the embodiment that omits optional step 1208, the reflected incident radiation will be transmitted back through the first capping layer having an amorphous structure. In the embodiment that includes optional step 1208, the reflected incident radiation will be transmitted back through the first capping layer and the second capping layer on its path to the material to be patterned. After the material to be patterned has been exposed to the radiation reflected from the EUV mask, portions of the material exposed or not exposed to the radiation reflected from the EUV mask are removed at step 1212.

Figure 8:
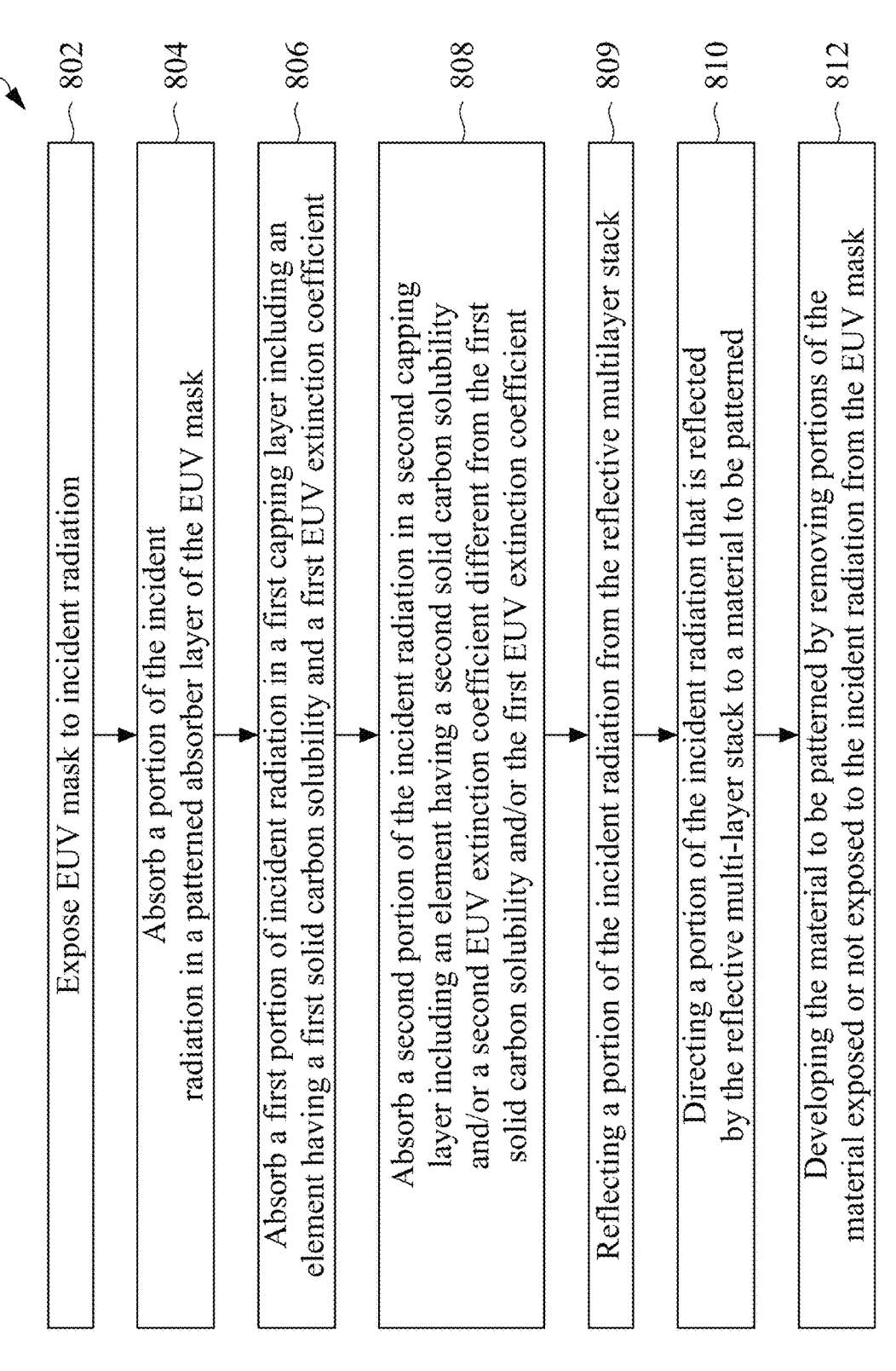
FIG. 8 is a flowchart of a method of using an EUV mask in accordance with some embodiments.

FIG. 8 illustrates a method 800 of using an EUV mask in accordance with embodiments of the present disclosure. Method 800 includes step 802 of exposing an EUV mask to an incident radiation, e.g., EUV radiation. An example of an EUV mask useful in step 802 includes the EUV masks 400 described above. At step 804, a portion of the incident radiation is absorbed in a patterned absorber layer of the EUV mask. At step 806, an amount of a first portion of the incident radiation is absorbed in the first capping layer including an element having a first solid carbon solubility and a first EUV extinction coefficient. An example of a capping layer having a first carbon solubility and a first EUV extinction property includes the second capping layers 130' described above. At step 808, an amount of a second portion of the incident radiation is absorbed by a second capping layer including an element having a second solid carbon solubility and/or a second EUV extinction coefficient different from the first solid carbon solubility and/or the first EUV extinction coefficient. In some embodiments, the amount of the first portion of incident radiation absorbed by the first capping layer is different from the amount of incident radiation absorbed by the second capping layer. Examples of second capping layer include the first capping layers 120' described above. At step 809, a portion of the incident radiation is reflected from the reflective multilayer stack. A portion of the incident radiation that is reflected by the reflective multilayer stack is directed to a material to be patterned in step 810. The reflected incident radiation will be transmitted back through the first capping layer and the second capping layer on its path to the material to be patterned. After the material to be patterned has been exposed to the radiation reflected from the EUV mask, portions of the material exposed or not exposed to the radiation reflected from the EUV mask are removed at step 812.

Figure 9:
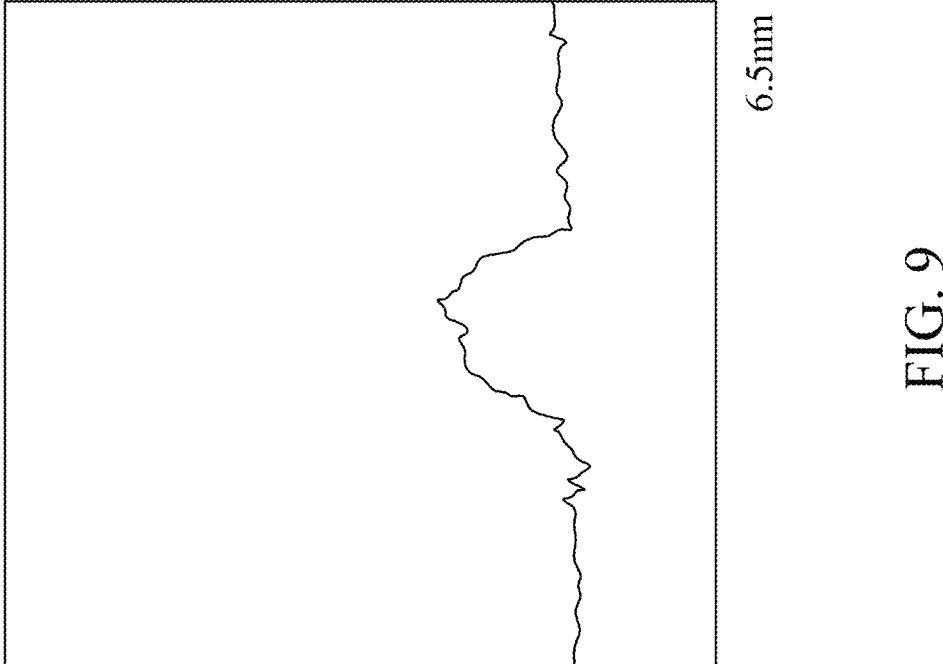
FIG. 9 is an illustration of the results of an assessment of the thickness of carbon contamination on a capping layer in accordance with embodiments of the present disclosure.

FIG. 9 illustrates the results of an analysis of thickness of carbon contamination on a capping feature containing an Rh containing alloy, e.g., RuRh in accordance with embodiments of the present disclosure. As illustrated in FIG. 9, the thickness of the carbon contamination is on the order of 6.5 nm. In contrast, thickness of carbon contamination on a capping feature not formed in accordance with the present disclosure and exposed to the same lithography conditions as the capping feature of FIG. 9, was observed to be greater, e.g., on the order of 11.7 nm. This is approximately a 40% decrease in thickness of carbon contamination achieved by capping layers in accordance with the present disclosure.

One aspect of this description relates to an EUV mask. The EUV mask includes a substrate, a reflective multilayer stack on the substrate, and a capping feature on the reflective multilayer stack. The capping feature includes a first capping layer including material having an amorphous structure. In some embodiments, the amorphous structure includes a nano-crystalline structure having grain size less than 2 nm. The EUV mask also includes a patterned absorber layer on the multilayer capping feature. In some embodiments, the first capping layer includes a material including an element having a solid carbon solubility, at an eutectic point of a system containing the element and carbon, that is less than 3 atomic %. Such EUV masks exhibit a reduced propensity to carbon build up or contamination which can negatively affect the ability of the mask to produce patterns that satisfy critical dimension criteria. In addition, such EUV capping features exhibit a resistance to weakening by etchants or cleaners that the capping layer is exposed to during manufacturing of the EUV mask.

Another aspect of this description relates to a method of using an EUV mask. The method includes exposing an EUV mask to an incident radiation. The EUV mask includes a substrate, a reflective multilayer stack on the substrate and a multilayer capping feature on the reflective multilayer stack. The multilayer capping feature includes a first capping layer including a Rh, Ir, Pt, Au or Zr containing first alloy and a second capping layer including a Rh, Ir, Pt, Au or Zr containing second alloy different from the first alloy. The EUV mask includes a patterned absorber layer on the multilayer capping feature. The method includes absorbing a portion of the incident radiation in the patterned absorber layer. A portion of the incident radiation is transmitted through the first capping layer and the second capping layer. A portion of the incident radiation is reflected from the reflective multilayer stack and directed to a material to be patterned. In some embodiments, the first alloy and the second alloy are selected from RuZr, IrZr, RhZr, HfZr and NbZr, wherein the Zr content of the first alloy and the second alloy is at least 5 atomic %.

Still another aspect of this description relates to another method of using an EUV mask. The method includes exposing the EUV mask to an incident radiation. The EUV mask includes a substrate, a reflective multilayer stack on the substrate, a capping feature and a patterned absorber layer on the capping feature. The capping feature includes a material including an element having a solid carbon solubility, at an eutectic point of a system of the element and carbon, that is less than three atomic percent. The method further includes absorbing a portion of incident radiation in the patterned absorber layer. In the method, a portion of the incident radiation is absorbed in the capping layer. The method proceeds with reflecting a portion of the incident radiation from the reflective multi-stack layer and directing it to a material to be patterned.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. An extreme ultraviolet (EUV) mask, comprising:
a substrate;
a reflective multilayer stack on the substrate;
a capping feature on the reflective multilayer stack, the capping feature including a first capping layer including a material having an amorphous structure, wherein the material of the first capping layer is an alloy selected from the group consisting of IrZr, RhZr, HfZr, NbZr and ZnZr; and
a patterned absorber layer on the capping feature.
2. The EUV mask of claim 1, wherein the amorphous structure includes a nano-crystalline structure having a grain size of less than 5 nanometers.
3. The EUV mask of claim 1, wherein the amorphous structure includes a nano-crystalline structure having a grain size of less than 2 nanometers.
4. The EUV mask of claim 1, wherein the capping feature further comprises a second capping layer including a material having an amorphous structure, the material of the second capping layer being different from the material of the first capping layer.
5. The EUV mask of claim 4, wherein the material of the first capping layer includes an element having an EUV extinction coefficient for EUV radiation having a wavelength of 13.5 nm that is different from an EUV extinction coefficient for EUV radiation having a wavelength of 13.5 nm of an element of the material of the second capping layer.
6. The EUV mask of claim 5, wherein the EUV extinction coefficient for EUV radiation having a wavelength of 13.5 nm of the element of the material of the first capping layer is between 0 and 0.1.
7. The EUV mask of claim 5, wherein the EUV extinction coefficient for EUV radiation having a wavelength of 13.5 nm of the element of the material of the second capping layer is between 0 and 0.1.

8. The EUV mask of claim 4, wherein the material of the first capping layer includes an element having a solid carbon solubility, at an eutectic point of a system containing the element and carbon, that is less than 3 atomic %.

9. The EUV mask of claim 4, wherein the material of the second capping layer includes an element having a solid carbon solubility, at an eutectic point of a system containing the element and carbon, that is less than 3 atomic %.

10. The EUV mask of claim 4, wherein the material of the second capping layer is an alloy containing one or more elements selected from Rh, Ir, Pt, Au and Zr thereof.

11. The EUV mask of claim 10 wherein the alloy of the second capping layer further includes Hf, Nb or N.

12. An extreme ultraviolet (EUV) mask, comprising:

a substrate;

a reflective multilayer stack on the substrate;

a multi-layer capping feature on the reflective multilayer stack, the multi-layer capping feature including a first capping layer including a first alloy and a second capping layer including a second alloy different from the first alloy, wherein the first alloy and the second alloy are independently selected from the group consisting of PtIr, NbIr, RhN, IrN, PtIrN, NbIrN, NbPtN and NbRhN; and a patterned absorber layer on the multi-layer capping feature.

13. An extreme ultraviolet (EUV) mask, comprising:

a substrate;

a reflective multilayer stack on the substrate;

a capping feature on the reflective multilayer stack, the capping feature including a layer of a first material including an element having a solid carbon solubility, at an eutectic point of a system of the element and carbon, that is less than 3 atomic %, wherein the first material of the capping feature is an alloy selected from the group consisting of IrZr, RhZr, HfZr, NbZr, PtIr, NbIr, RhN, IrN, PtIrN, NbIrN, NbPtN and NbRhN; and a patterned absorber layer on the capping feature.

14. The EUV mask of claim 13, wherein the solid carbon solubility at the eutectic point is less than 2 atomic %.

15. The EUV mask of claim 1, wherein the reflective multilayer stack comprises alternatively stacked layers of a high refractive index material and a low refractive index material.

16. The EUV mask of claim 15, wherein the reflective multilayer stack comprises the alternatively stacked layers of Mo and Si.

17. The EUV mask of claim 12, wherein the patterned absorber layer comprises an alloy of transition metals.

18. The EUV mask of claim 12, wherein the patterned absorber layer comprises a pattern of openings that expose a surface of the second capping layer.

19. The EUV mask of claim 13, wherein the capping feature further comprises a layer of a second material over the layer of the first material, wherein the second material is an alloy comprising one or more elements selected from Rh, Ir, Pt, Au and Zr.

20. The EUV mask of claim 13, wherein the second material further includes Hf, Nb or N.

* * * * *